(12) United States Patent
Zhao et al.

(10) Patent No.: US 7,482,686 B2
(45) Date of Patent: Jan. 27, 2009

(54) MULTIPIECE APPARATUS FOR THERMAL AND ELECTROMAGNETIC INTERFERENCE (EMI) SHIELDING ENHANCEMENT IN DIE-UP ARRAY PACKAGES AND METHOD OF MAKING THE SAME

(75) Inventors: Sam Ziqun Zhao, Irvine, CA (US); Reza-ur Rahman Khan, Rancho Santa Margarita, CA (US)

(73) Assignee: Braodcom Corporation, Irvine, CA (US)

( * ) Notice: Subject to any disclaimer, the term of this patent is extended or adjusted under 35 U.S.C. 154(b) by 564 days.

(21) Appl. No.: 10/870,929

(22) Filed: Jun. 21, 2004

(65) Prior Publication Data

US 2005/0280139 A1    Dec. 22, 2005

(51) Int. Cl.
    *H01L 23/10*    (2006.01)
(52) U.S. Cl. .................. 257/710; 257/704; 257/687
(58) Field of Classification Search .......... 257/87–689, 257/704, 705, 706, 710
    See application file for complete search history.

(56) References Cited

U.S. PATENT DOCUMENTS

| | | | |
|---|---|---|---|
| 3,790,866 | A | 2/1974 | Meyer et al. |
| 4,611,238 | A | 9/1986 | Lewis et al. |
| 5,045,921 | A | 9/1991 | Lin et al. |
| 5,065,281 | A | 11/1991 | Hernandez et al. |
| 5,153,379 | A * | 10/1992 | Guzuk et al. ............ 174/35 R |
| 5,173,766 | A | 12/1992 | Long et al. |
| 5,208,504 | A | 5/1993 | Parker et al. |
| 5,216,278 | A | 6/1993 | Lin et al. |
| 5,285,352 | A | 2/1994 | Pastore et al. |
| 5,291,062 | A | 3/1994 | Higgins, III |

(Continued)

FOREIGN PATENT DOCUMENTS

DE          42 13 251 A1       10/1992

(Continued)

OTHER PUBLICATIONS

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491-495.

(Continued)

*Primary Examiner*—Phat X. Cao
*Assistant Examiner*—Abul Kalam
(74) *Attorney, Agent, or Firm*—Sterne, Kessler, Goldstein & Fox, PLLC.

(57) ABSTRACT

A die-up array integrated circuit (IC) device package and method of making the same is presented. A frame body has opposing first and second surfaces and a central opening that is open at the first and second surfaces. The second frame body surface is mounted to a first stiffener surface. An IC die is mounted to the first stiffener surface within the central opening through the frame body. A planar lid has opposing first and second surfaces. The second lid surface is coupled to the first frame body surface. A first substrate surface is coupled to a second stiffener surface. An array of electrically conductive terminals is coupled to a second substrate surface. The stiffener, frame body, and lid form an enclosure structure substantially enclosing the IC die. The die enclosure spreads heat from the IC die, and shields EMI emanating from and radiating toward the IC die.

19 Claims, 33 Drawing Sheets

U.S. PATENT DOCUMENTS

| | | |
|---|---|---|
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A * | 6/1997 | Bond et al. ............... 361/704 |
| 5,648,679 A | 7/1997 | Chillara et al. |
| 5,650,659 A * | 7/1997 | Mostafazadeh et al. ..... 257/660 |
| 5,650,662 A | 7/1997 | Edwards et al. |
| 5,668,406 A * | 9/1997 | Egawa ...................... 257/690 |
| 5,691,567 A | 11/1997 | Lo et al. |
| 5,717,252 A | 2/1998 | Nakashima et al. |
| 5,732,465 A | 3/1998 | Tokita et al. |
| 5,736,785 A | 4/1998 | Chiang et al. |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A * | 11/1999 | Mostafazadeh et al. ..... 257/713 |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,020,637 A | 2/2000 | Karnezos |
| 6,028,358 A | 2/2000 | Suzuki |
| 6,034,427 A | 3/2000 | Lan et al. |
| 6,040,984 A | 3/2000 | Hirakawa |
| 6,057,601 A | 5/2000 | Lau et al. |
| 6,060,777 A | 5/2000 | Jamieson et al. |
| 6,064,111 A | 5/2000 | Sota et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,092,281 A * | 7/2000 | Glenn ......................... 29/841 |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,229,702 B1 * | 5/2001 | Tao et al. ................... 361/704 |
| 6,242,279 B1 | 6/2001 | Ho et al. |
| 6,246,111 B1 | 6/2001 | Huang et al. |
| 6,278,613 B1 | 8/2001 | Fernandez et al. |
| 6,288,444 B1 | 9/2001 | Abe et al. |
| 6,313,521 B1 | 11/2001 | Baba |
| 6,313,525 B1 | 11/2001 | Sasano |
| 6,347,037 B2 | 2/2002 | Iijima et al. |
| 6,362,525 B1 | 3/2002 | Rahim |
| 6,365,980 B1 | 4/2002 | Carter, Jr. et al. |
| 6,369,455 B1 | 4/2002 | Ho et al. |
| 6,380,623 B1 | 4/2002 | Demore |
| 6,432,742 B1 | 8/2002 | Guan et al. |
| 6,462,274 B1 | 10/2002 | Shim et al. |
| 6,472,741 B1 | 10/2002 | Chen et al. |
| 6,525,942 B2 | 2/2003 | Huang et al. |
| 6,528,869 B1 | 3/2003 | Glenn et al. |
| 6,528,892 B2 | 3/2003 | Caletka et al. |
| 6,541,832 B2 | 4/2003 | Coyle |
| 6,545,351 B1 | 4/2003 | Jamieson et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,563,712 B2 | 5/2003 | Akram et al. |
| 6,583,516 B2 | 6/2003 | Hashimoto |
| 6,602,732 B2 | 8/2003 | Chen |
| 6,614,660 B1 | 9/2003 | Bai et al. |
| 6,617,193 B1 | 9/2003 | Toshio et al. |
| 6,657,870 B1 | 12/2003 | Ali et al. |
| 6,664,617 B2 | 12/2003 | Siu |
| 6,724,071 B2 | 4/2004 | Combs |
| 6,724,080 B1 | 4/2004 | Ooi et al. |
| 6,737,750 B1 | 5/2004 | Hoffman et al. |
| 6,775,140 B2 * | 8/2004 | Shim et al. ................ 361/704 |
| 6,825,108 B2 | 11/2004 | Khan et al. |
| 6,838,761 B2 | 1/2005 | Karnezos |
| 6,861,750 B2 | 3/2005 | Zhao et al. |
| 6,876,553 B2 | 4/2005 | Zhao et al. |
| 6,906,414 B2 | 6/2005 | Zhao et al. |
| 6,989,593 B2 | 1/2006 | Khan et al. |
| 7,005,737 B2 | 2/2006 | Zhao et al. |
| 7,015,072 B2 * | 3/2006 | Combs et al. ............... 438/122 |
| 7,026,711 B2 * | 4/2006 | Lee et al. .................... 257/706 |
| 7,038,312 B2 | 5/2006 | Khan et al. |
| 7,057,277 B2 | 6/2006 | Chen et al. |
| 7,061,102 B2 * | 6/2006 | Eghan et al. ................ 257/713 |
| 7,102,225 B2 | 9/2006 | Khan et al. |
| 7,148,084 B2 * | 12/2006 | Strobel et al. ............... 438/115 |
| 7,161,239 B2 | 1/2007 | Zhao et al. |
| 7,196,415 B2 | 3/2007 | Zhong et al. |
| 7,198,987 B1 * | 4/2007 | Warren et al. ............... 438/112 |
| 7,227,256 B2 | 4/2007 | Zhao et al. |
| 7,245,500 B2 | 7/2007 | Khan et al. |
| 2001/0001505 A1 | 5/2001 | Schueller et al. |
| 2001/0040279 A1 | 11/2001 | Mess et al. |
| 2001/0045644 A1 | 11/2001 | Huang |
| 2002/0053731 A1 | 5/2002 | Chao et al. |
| 2002/0072214 A1 | 6/2002 | Yuzawa et al. |

| | | | |
|---|---|---|---|
| 2002/0079562 A1 | 6/2002 | Zhao et al | |
| 2002/0079572 A1* | 6/2002 | Khan et al. | 257/707 |
| 2002/0096767 A1 | 7/2002 | Cote et al. | |
| 2002/0098617 A1 | 7/2002 | Lee et al. | |
| 2002/0109226 A1 | 8/2002 | Khan et al. | |
| 2002/0135065 A1 | 9/2002 | Zhao et al. | |
| 2002/0171144 A1 | 11/2002 | Zhang et al. | |
| 2002/0180040 A1 | 12/2002 | Camenforte et al. | |
| 2002/0185717 A1 | 12/2002 | Eghan et al. | |
| 2002/0185720 A1 | 12/2002 | Khan et al. | |
| 2002/0185722 A1 | 12/2002 | Zhao et al. | |
| 2002/0185734 A1 | 12/2002 | Zhao et al. | |
| 2002/0185750 A1 | 12/2002 | Khan et al. | |
| 2002/0190361 A1 | 12/2002 | Zhao et al. | |
| 2002/0190362 A1 | 12/2002 | Khan et al. | |
| 2003/0057550 A1 | 3/2003 | Zhao et al. | |
| 2003/0111726 A1 | 6/2003 | Khan et al. | |
| 2003/0138613 A1 | 7/2003 | Thoman et al. | |
| 2003/0146503 A1 | 8/2003 | Khan et al. | |
| 2003/0146506 A1 | 8/2003 | Khan et al. | |
| 2003/0146509 A1 | 8/2003 | Zhao et al. | |
| 2003/0146511 A1 | 8/2003 | Zhao et al. | |
| 2003/0179549 A1 | 9/2003 | Zhong et al. | |
| 2003/0179558 A1 | 9/2003 | Zhao et al. | |
| 2004/0072456 A1 | 4/2004 | Dozier, II et al. | |
| 2004/0113284 A1 | 6/2004 | Zhao et al. | |
| 2005/0280127 A1 | 12/2005 | Zhao et al. | |
| 2006/0065972 A1 | 3/2006 | Khan et al. | |

FOREIGN PATENT DOCUMENTS

| | | |
|---|---|---|
| EP | 0 504 411 B1 | 6/1998 |
| FR | 2 803 098 A3 | 6/2001 |
| JP | 61-49446 A | 3/1986 |
| JP | 0 573 297 A2 | 12/1993 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |

OTHER PUBLICATIONS

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMS: BGAs Provide a Fine-Pitch Alternative", *Advanced Packaging*, IHS Publishing Group, Sep./Oct. 1994, vol. 3, No. 5, pp. 28, 30, and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

English-language Abstract JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International, Proceedings of The Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package",*IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAz Face Production Testing: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE,1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue To Evolve", *Electronic Design*, Feb. 6, 1995, pp. 141-146.

"How To Give Your BGAs A Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Kamezos, M. , "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI LOGIC Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthrough Achieved with the New *Super*BGA® Package", *1995 International Electronics Packaging Conference*, San Diego, California, Sep. 24-27, 1995, pp. 565-576.

Marrs, R.C. and Olachea, G., "BGAs For MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.
"New PBGA Pushes Technology to Outer Limits", *Advanced Packaging*, HIS Publishing Group, Jan./Feb. 1995, p. 11.
Olachea, G., "Managing Heat: A Focus on Power IC Packaging", *Electronic Packaging & Production (Special Supplement)*, Cahners Publishing Company, Nov. 1994, pp. 26-28.
"Pad Array Improves Density", *Electronic Packaging & Production*, Cahners Publishing Company, May 1992, pp. 25-26.
Partridge, J. and Viswanadham, P., "Organic Carrier Requirements for Flip Chip Assemblies", *Journal of Surface Mount Technology*, Surface Mount Technology Association, Jul. 1994, pp. 15-20.
Ramirez, C. and Fauser, S., "Fatigue Life Comparison of The Perimeter and Full Plastic Ball Grid Array", *Surface Mount International Conference Proceedings*, Surface Mount International, Aug. 28-Sep. 1, 1994, San Jose, California, pp. 258-266.
Rogren, P., "MCM-L Built on Ball Grid Array Formats", *National Electronic Packaging and Production Conference West '94*, Feb. 27-Mar. 4, 1994, Anaheim, California, pp. 1277-1282.
Rooks, S., "X-Ray Inspection of Flip Chip Attach Using Digital Tomosynthesis", *Surface Mount International Proceedings of The Technical Program*, Aug. 28-Sep. 1, 1994, San Jose, California, pp. 195-202.
Rukavina, J., "Attachment Methodologies: Ball Grid Array Technology", *Ball Grid Array National Symposium*, Dallas, Texas, Mar. 29-30, 1995, 36 pages.
Sack, T., "Inspection Technology", *Ball Grid Array National Symposium*, Dallas, Texas, Mar. 29-30, 1995, pp. 1-41.
Sakaguchi, H., "BGA Mounting Technology," pp. 1-4, date and source unknown.
Schmolze, C. and Fraser, A., "SPICE Modeling Helps Enhance BGA Performance", *Electronic Packaging & Production*, Jan. 1995, pp. 50-52.
Schueller, R.D. et al., "Performance and Reliability of a Cavity Down Tape BGA Package," *IEEE Electronic Packaging Technology Conference*, 1997, pp. 151-162.
*Semiconductor Group Package Outlines Reference Guide*, Texas Instruments, 1995, entire document submitted.
Shimizu, J., "Plastic Ball Grid Array Coplanrity", *Surface Mount International Conference*, San Jose, California, Aug. 31-Sep. 2, 1993, pp. 86-91.
Sigliano, R., "Using BGA Packages: An Appealing Technology in a QFP and Fine-Pitch Market", *Advanced Packaging*, IHS Publishing Group, Mar./Apr. 1994, pp. 36-39.
Sirois, L., "Dispensing for BGA: Automated Liquid Dispensing in a High-Density Environment", *Advanced Packaging*, IHS Publishing Group, May/Jun. 1995, pp. 38 and 41.
Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.
"Survival of the Fittest", *Advanced Packaging*, IHS Publishing Group, Mar./Apr. 1995, page unknown.
Thompson, T., "Reliability Assessment of a Thin (Flex) BGA Using a Polyimide Tape Substrate", *International Electronics Manufacturing Technology Symposium*, IEEE, 1999, pp. 207-213.
Tuck, J., "BGA Technology Branches Out", *Circuits Assembly*, Feb. 1995, vol. 6, No. 2, pp. 24, 26, and 28.
"Tutorial and Short Courses", *45th Electronic Components & Technology Conference*, May 21-24, 1995, Las Vegas, Nevada, IEEE, 4 pages.
Vardaman, E. J. and Crowley, R.T., "Worldwide Trends in Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.
Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.
Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.
Yip, W.Y., "Package Characterization of a 313 Pin BGA", *National Electronic Packaging and Production Conferece West '95*, Reed Exhibition Companies, Feb. 26-Mar. 2, 1995, Anaheim, California, pp. 1530-1541.
Zamborsky, E., "BGAs in the Assembly Process", *Circuits Assembly*, Feb. 1995, vol. 6, No. 2, pp. 60, 62-64.
Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.
Zhao, Z., Ph.D., "Thermal Design and Modeling of Packages," *IEEE Short Courses*, Broadcom Corporation, Oct. 25, 2000, 95 pages.
Zimerman, M., "High Performance BGA Molded Packages for MCM Application", *Surface Mount International Conference Proceedings*, Surface Mount International, Aug. 28-Sep. 1, 1994, San Jose, California, pp. 175-180.
Zweig, G., "BGAs: Inspect the Process, Not the Product", *Electronic Packaging & Production (Special Supplement)*, Cahners Publishing Company, Aug. 1994 (Supplement), p. 41.
Freyman, B. and Petrucci, M., "High-Pincount PBGAs: Implementation Into Volume Manufacturing," *Advanced Packaging*, An IHS Group Publication, May/Jun. 1995, pp. 44-46.
English-language Abstract of FR 2803098, published Jun. 29, 2001, 1 page, printed from http://v3.espacenet.com.
English-language Summary of Decision of Rejection from Taiwanese Application No. 91108573, 5 pages.
Zhao et al., U.S. Appl. No. 10/284,340, filed Oct. 31, 2002, entitled "Ball Grid Array Package With Patterned Stiffener Layer," 137 pages.
Amkor package data sheet, "SuperFC®", from http://www.amkor.com/Products/all_datasheets/superfc.pdf, 2 pages (Jan. 2003).
Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).
Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).
Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).
Harper, C.A. (ed.), *Electronic Packaging And Interconnection Handbook*, Third Edition, pp. 7.58-7.59, ISBN No. 0-07-134745-3, McGraw-Hill Companies (2000).
Lin, S. and Chang, N., "Challenges in Power-Ground Integrity," *Proceedings Of The 2001 International Conference On Computer-Aided Design*, pp. 651-654 (Nov. 4-8, 2001).
Lloyd, J. and Overhauser, D., "Electromigration wreaks havoc on IC design," *EDN*, pp. 145-148 (Mar. 26, 1998).
Song, W.S. and Glasser, L.A., "Power Distribution Techniques for VLSI Circuits," *IEEE Journal Of Solid-State Circuits*, vol. SC-21, No. 1, pp. 150-156 (Feb. 1986).
Tang, K.T. and Friedman, E.G., "Simultaneous Switching Noise in On-Chip CMOS Power Distribution Networks," *IEEE Transactions On Very Large Scale Integration (VLSI) Systems*, vol. 10, No. 4, pp. 487-493 (Aug. 2002).

* cited by examiner

FIG.2 --Prior Art--

--Prior Art--

--Prior Art--

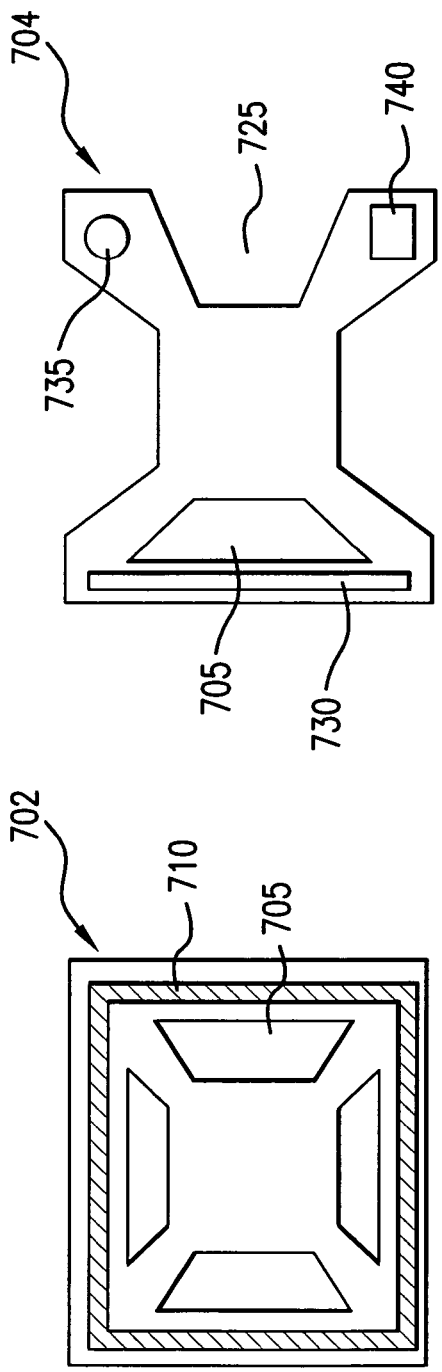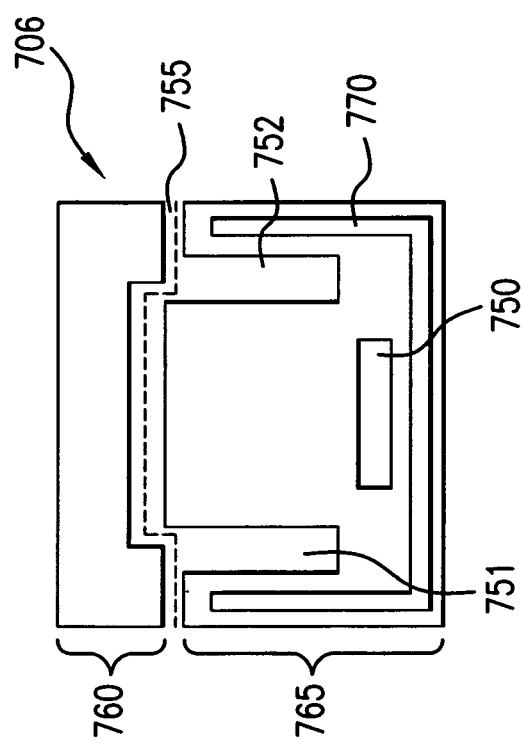
FIG.7A
FIG.7B
FIG.7C

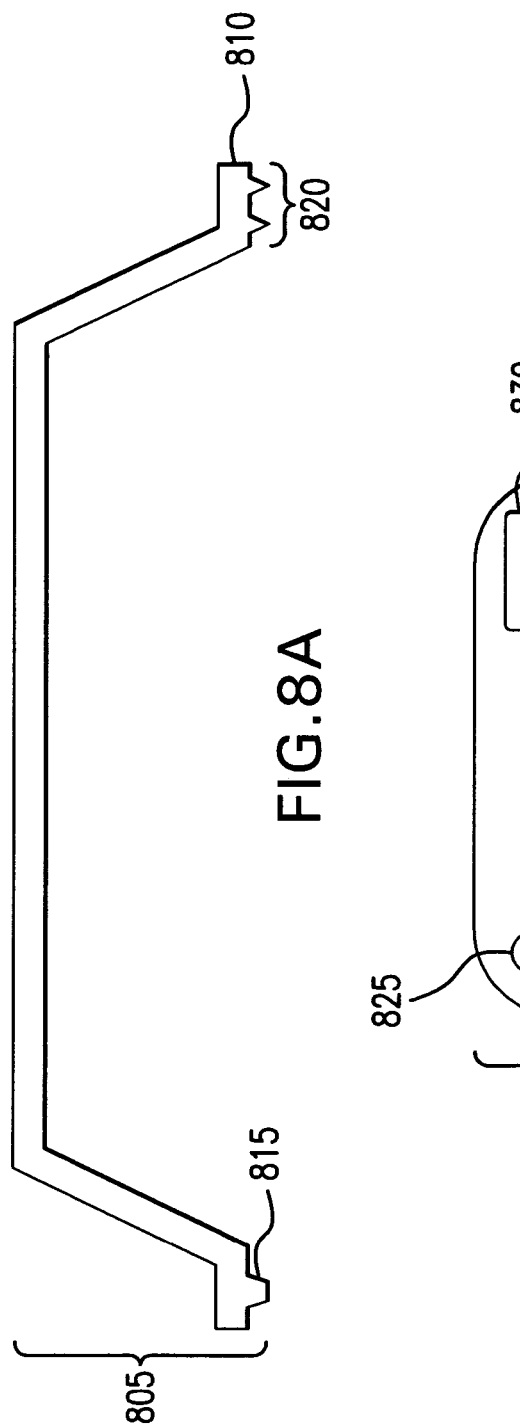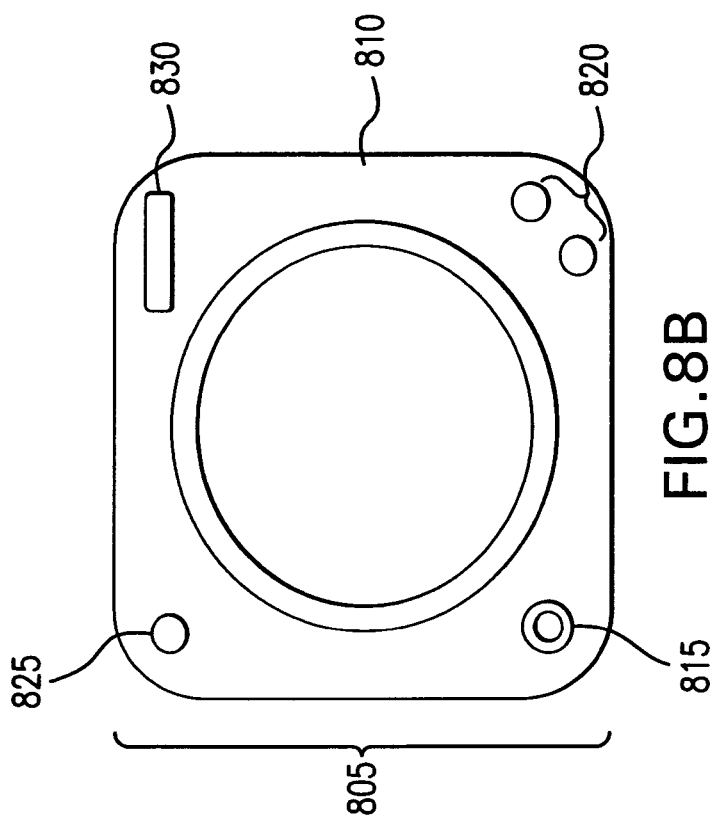
FIG.8A
FIG.8B

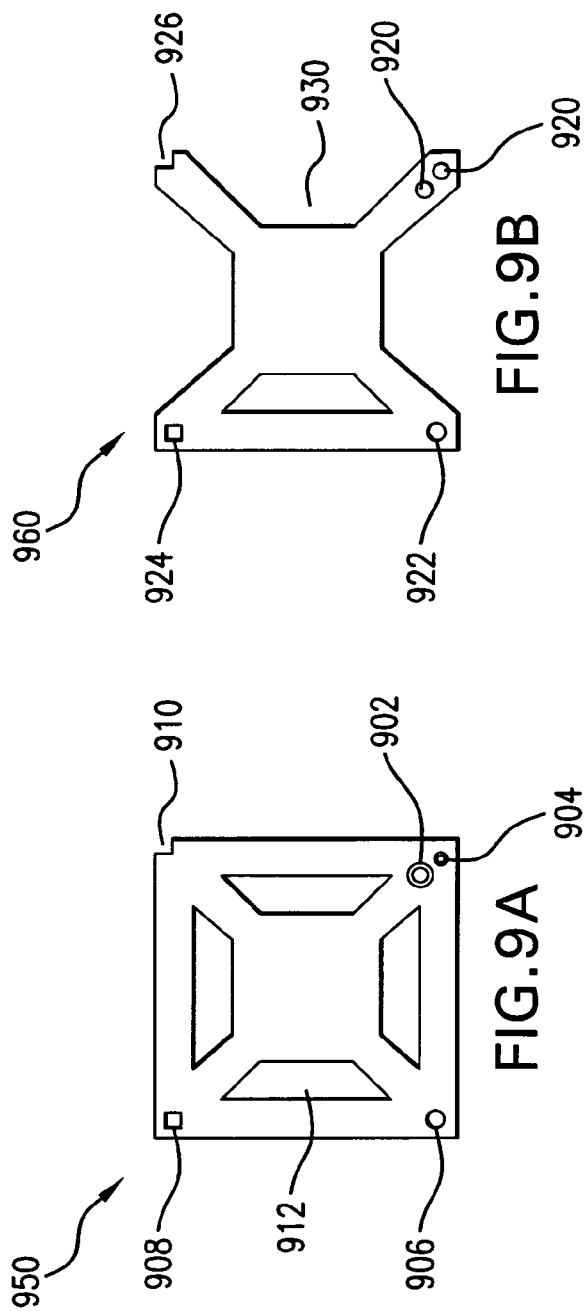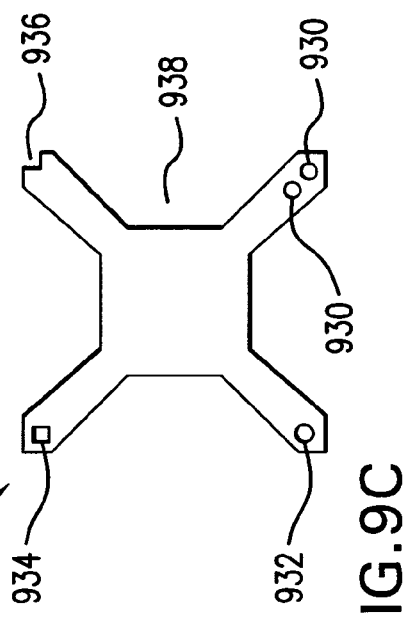

MULTIPIECE APPARATUS FOR THERMAL AND ELECTROMAGNETIC INTERFERENCE (EMI) SHIELDING ENHANCEMENT IN DIE-UP ARRAY PACKAGES AND METHOD OF MAKING THE SAME

CROSS-REFERENCE TO RELATED APPLICATIONS

The following patent application of common assignee is related to the present application, and is herein incorporated by reference in its entirety: "Ball Grid Array Package Enhanced With A Thermal And Electrical Connector," U.S. patent application Ser. No. 10/284,312, filed Oct. 31, 2002.

The following application of common assignee is related to the present application, has the same filing date as the present application, and is herein incorporated by reference in its entirety: "Apparatus And Method For Thermal And Electromagnetic Interference (EMI) Shielding Enhancement In Die-Up Array Packages," Ser. No. 10/870,927.

BACKGROUND OF THE INVENTION

1. Field of the Invention

The invention relates generally to the field of integrated circuit (IC) device packaging technology and, more particularly to thermal enhancement and electromagnetic interference (EMI) shielding in IC device packages.

2. Background Art

IC semiconductor dies are typically mounted in or on a package that is attached to a printed circuit board (PCB). Example IC device packages include ball grid array (BGA), pin grid array (PGA), and land grid array (LGA) packages. A conventional BGA package has an array of solder balls located on a bottom external surface of a package substrate. The solder balls are reflowed to attach the package to the PCB. The IC die is typically mounted to a top surface of the package substrate. Wire bonds typically couple signals of the IC die to the substrate. The substrate has internal routing that electrically couples the signals of the IC die to the solder balls on the bottom substrate surface. A molding compound encapsulates the IC die, wire bonds, and the entire or partial top surface of the substrate to provide environmental protection.

Die-up and die-down BGA package configurations exist. In die-up BGA packages, the IC die is mounted on the top surface of the substrate, so that the active surface of the IC die is directed away from the PCB. In die-down BGA packages, the IC die is mounted on the bottom surface of the substrate, so that the active surface of the IC die is directed towards the PCB.

Problems with conventional BGA packages include poor thermal performance and inadequate EMI protection. Resin substrates and plastic molding compounds have low thermal conductivity values (e.g., about 0.19-0.3 W/m·° C. for typical resin substrates, and about 0.2-0.9 W/m·° C. for typical molding compounds). When materials with poor thermal conductivity surround the IC die, heat generated by the IC die is trapped within the BGA package. Also, resin substrates and plastic molding compounds are transparent to EMI. Consequently, EMI generated by the IC die can pass through the resin substrate and plastic molding compound and interfere with electronic components outside of the package. Likewise, EMI generated by electronic components outside of the package can pass through the resin substrate and plastic molding compound and interfere with the IC die.

Therefore, what is needed is a die-up array IC device package that provides enhanced ability to dissipate heat generated by the IC die, and shields EMI emanating from the IC die, as well as EMI radiating toward the IC die from outside the package.

BRIEF SUMMARY OF THE INVENTION

The present invention is directed to an apparatus and method for enhancing thermal performance and electromagnetic interference (EMI) shielding in die-up array integrated circuit (IC) device packages.

In an embodiment of the present invention, a die-up array IC device package includes a stiffener having opposing first and second surfaces, and an IC die mounted to the first surface of the stiffener. The package further includes a cap body having opposing first and second surfaces. A first portion of the second surface has a cavity formed therein, and a planar second portion of the second surface is coupled to the first surface of the stiffener. The package further includes a substrate having a first surface coupled to the second surface of the stiffener. A plurality of contact pads on the first surface are electrically connected through the substrate to an array of electrically conductive terminals on a second surface of the substrate. The stiffener and the cap body form an enclosure that substantially encloses the IC die. The die enclosure spreads heat from the IC die during operation of the IC die. Additionally or alternatively, the die enclosure shields EMI emanating from the IC die, as well as EMI radiating toward the IC die from outside the package.

In another embodiment, the cap body further includes a rim extending around a bottom periphery of the cap body. Additionally or alternatively, the cavity formed in the first portion of the second surface of the cap body has a substantially rectangular cross-section.

In another embodiment, the package includes a frame body and a planar lid body. The frame body has opposing first and second surfaces and a central opening that is open at the first and second surfaces. The second surface of the frame body is coupled to the first surface of the stiffener. The IC die is mounted to the first surface of the stiffener through the central opening through the frame body. A second surface of the planar lid body is coupled to the first surface of the frame body, overlapping the central opening through the frame body. In this embodiment, the stiffener, the frame body, and the planar lid body form the die enclosure.

In another embodiment, the package further includes at least one electrically conductive plated area patterned on the first surface of the stiffener in areas in contact with the cap body.

In another embodiment, the package further includes at least one tab member protruding from the surface of the rim and at least one receptacle formed in the first surface of the stiffener corresponding to the at least one tab member.

In another embodiment, the package further includes at least one wire bond that couples at least one bond pad on the IC die to the first surface of the stiffener to couple the die enclosure to an electrical potential.

In another embodiment, the package further includes an encapsulating material. In another embodiment, the package further includes an encapsulating material and at least one mold gate opening or at least one pressure release opening through the cap body.

In another embodiment, the package further includes a heat slug coupled to the second surface of the stiffener through an opening through the substrate. Additionally or alternatively, the package further includes a heat sink coupled to the first surface of the cap body.

In an embodiment of the present invention, a method of assembling a die-up array IC device package includes mounting an IC die to a first surface of a stiffener. The method further includes coupling a cap body to the first surface of the stiffener to form a die enclosure that substantially encloses the IC die.

In another embodiment, the cap body includes a lid body and a frame body. Thus, the step of coupling the cap body to the first surface of the stiffener includes coupling a second surface of the frame body to the stiffener, and coupling a second surface of the lid body to a first surface of the frame body.

In another embodiment, the method further includes encapsulating the IC die with an encapsulating material. In another embodiment, the method further includes encapsulating the IC die with an encapsulating material and forming at least one mold gate opening or at least one pressure release opening through the cap body.

In another embodiment, the method further includes forming a central opening through the substrate, and coupling a heat slug to the second surface of the stiffener through the central opening through the substrate. Additionally or alternatively, the method further includes coupling a heat sink to the first surface of the cap body.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention. The drawing in which an element first appears is typically indicated by the leftmost digit(s) in the corresponding reference number.

FIGS. 7A and 7B illustrate top views of one-piece stiffener configurations having plated areas, in accordance with embodiments of the present invention.

FIG. 7C illustrates a top view of a two-piece stiffener configuration having a plated area, in accordance with an embodiment of the present invention.

FIGS. 8A and 8B illustrate a cross-sectional view and bottom view, respectively, of a cap structure with protruding tab members, in accordance with an embodiment of the present invention.

FIGS. 9A-9C illustrate top views of a stiffener with receptacles formed in a surface, in accordance with embodiments of the present invention.

DETAILED DESCRIPTION OF THE INVENTION

Overview

Figure 1:
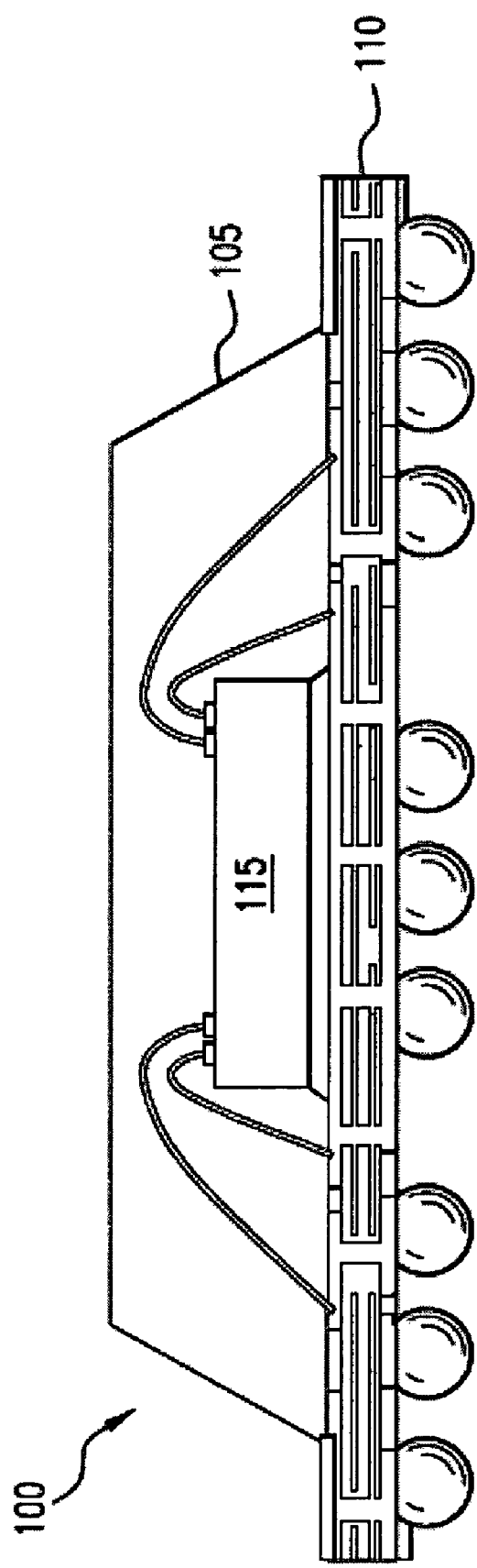
FIG. 1 illustrates a cross-sectional view of a conventional ball grid array (BGA) package.

The present invention is directed to an apparatus and method for enhancing thermal performance and electromagnetic interference (EMI) shielding in die-up array integrated circuit (IC) device packages. A die-up array IC device package includes a plurality of electrically conductive terminals (e.g., solder balls, pins, pads, etc.) arranged in an array (e.g., columns and rows) on a bottom surface of a substrate. Signals from an IC die mounted on a top surface of the substrate are routed through the substrate to the electrically conductive terminals. The electrically conductive terminals are configured to be attached to a printed circuit board (PCB). Examples of die-up array packages include BGA (e.g., pad array carrier, pad array package, land grid array, pad grid array packages), pin grid array, etc.

In embodiments of the present invention, a die-up array-type IC device package includes an IC die mounted to a first surface of a stiffener, and a package substrate coupled to a second surface of the stiffener. The package further includes a cap structure that has a cavity formed therein. The cap structure is coupled to the first surface of the stiffener so that the stiffener and the cap structure form an enclosure, which substantially encloses the IC die.

In embodiments, the die enclosure forms a thermally conductive path from the IC die to the outer surfaces of the package for enhanced heat spreading. Additionally, or in alternative embodiments, the die enclosure shields EMI emanating from the IC die, as well as EMI radiating toward the IC die from outside the package. Furthermore, in embodiments, the die enclosure can be coupled to a voltage to form an electrical potential plane (e.g., a voltage plane or a ground plane) surrounding the IC die for enhanced EMI shielding. The die enclosure also enhances rigidity and improves planarity of the printed circuit substrate, and protects the IC die from the environment (e.g., chemical corrosives, moisture, heat, vibration, and mechanical impact, etc.). Optional lock-in mechanisms on the cap structure and the stiffener (referred to herein as "protruding tabs" and "receptacles," respectively) can further enhance the thermal, electrical, and mechanical integrity of the die enclosure.

The cap structure can have various configurations. For example, described herein are a one-piece cap structure with a trapezoidal cavity and a rim, and a one-piece cap structure with a rectangular cavity and no rim (referred to herein as a "can" structure). Also described herein is a multiple-piece cap structure that has a frame-shaped portion, which is coupled to the stiffener, and a planar portion, which is coupled to the frame-shaped portion (the frame-shaped and planar portions are referred to herein as "ring" and "lid" structures, respectively). The invention is not, however, limited to these example cap structure configurations. Based on the description herein, persons skilled in the relevant art(s) will understand that these features can be combined in any manner, and that the invention can be implemented with other cap structure configurations (e.g., one-piece with a trapezoidal cavity and no rim, one-piece with a rectangular cavity and a rim, etc.). The cap structure can also be referred to as "heat spreader" or a "drop-in heat spreader," when used for thermal spreading.

The stiffener can be patterned in different forms (e.g., openings, cutouts, steps, etc.) or shapes (e.g., square, rectangular, circular, spoke-like, cutouts or notches and steps on one or more edges, etc.) to facilitate wire bond interconnects and to enhance package performance. The stiffener can also be finished using a variety of processes, materials, and methodologies at various surfaces, spots, and locations. Openings can be formed through the stiffener to facilitate electrical interconnects between the IC die and the substrate, and the stiffener and the substrate.

Example materials for the cap structure and the stiffener include copper, aluminum, aluminum based alloys, copper based alloys, ferromagnetic materials, laminated copper/iron, other metal and combinations of metals/alloys, other thermally and electrically conductive materials (e.g., ceramics, metallized plastics, etc.), and materials described elsewhere herein. Conventional types of substrate (e.g., organic, tape, and ceramic, etc.), as well as advanced types of substrate (e.g., high density substrate, build-up substrate, Teflon substrate, etc.) can be used. Single routing layer substrates, as well as multiple routing layer substrates can also be used.

In the detailed description that follows, example embodiments of the present invention are presented in detail. While specific features, configurations, and devices are discussed in detail, this description is provided for illustrative purposes, and persons skilled in the art will recognize from the teachings herein additional configurations and devices are within the scope and spirit of the invention.

Conventional BGA Packages

FIG. 1 illustrates a cross-sectional view of a conventional BGA package 100 with an IC semiconductor die 115 mounted on a printed circuit substrate 110, and a plastic molding compound 105 that encapsulates IC die 115. Heat generated by IC die 115 can be trapped within BGA package 100 because materials for plastic molding compound 105 and dielectric materials, such as resin epoxy or polyimide tape, for substrate 110 have low thermal conductivity. Additionally, BGA package 100 does not provide EMI shielding because materials for plastic molding compound 105 and dielectric materials, such as resin epoxy or polyimide tape, for substrate 110 are transparent to EMI.

Figure 2:
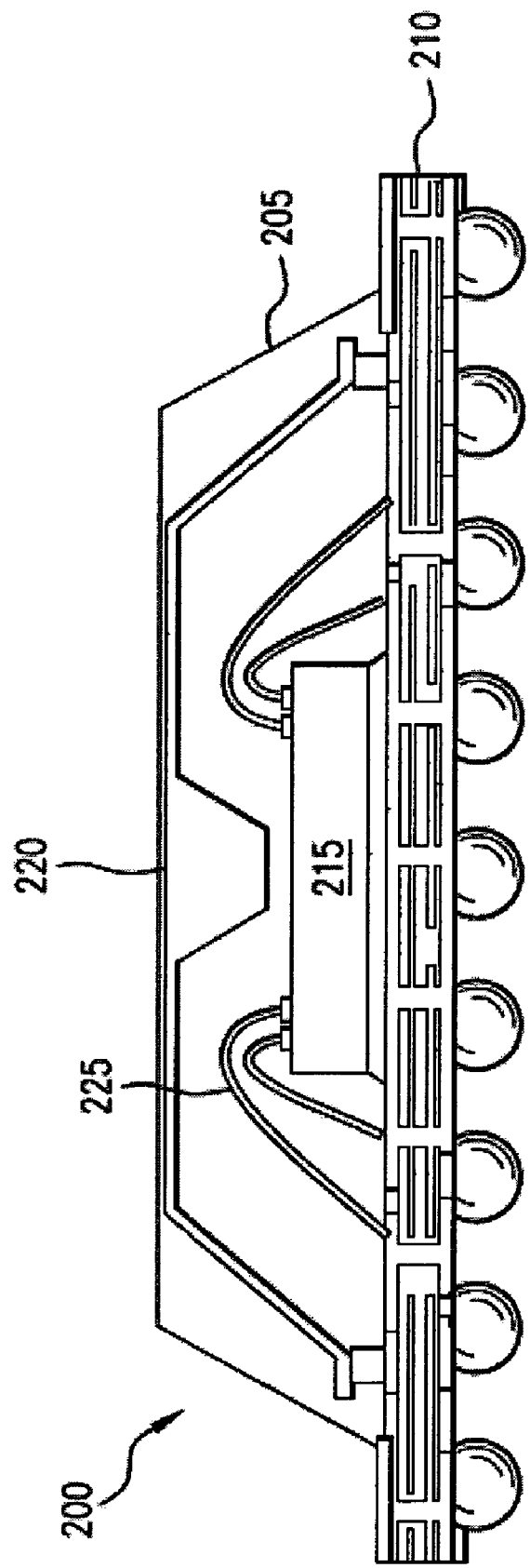
FIGS. 2 and 3 illustrate cross-sectional views of conventional BGA packages with drop-in heat spreaders.

FIG. 2 illustrates a cross-sectional view of a conventional BGA package 200 with an IC semiconductor die 215 mounted on a printed circuit substrate 210 and encapsulated by a mold compound 205. (See, e.g., U.S. Pat. No. 5,977,626, "Thermally and Electrically Enhanced PBGA Package," to Wang et al.). BGA package 200 includes a drop-in heat spreader 220 to promote dissipation of heat within plastic molding compound 205. However, direct contact between IC die 215 and heat spreader 220 is not permitted in package 200. This is required to avoid shorting heat spreader 220 with the active surface of IC die 215 and wire bond interconnections 225. Accordingly, heat generated by IC die 215 must pass through plastic molding compound 205 in order to reach heat spreader 220, and can therefore remain trapped within BGA package 200. Furthermore, drop-in heat spreader 220 only provides limited EMI shielding, if any. For example, EMI generated outside BGA package 200 can penetrate printed circuit substrate 210 and interfere with the operation of IC die 215. Also, EMI generated by IC die 215 can escape through trace metal openings or gaps in printed circuit substrate 210 to outside BGA package 200.

Figure 3:
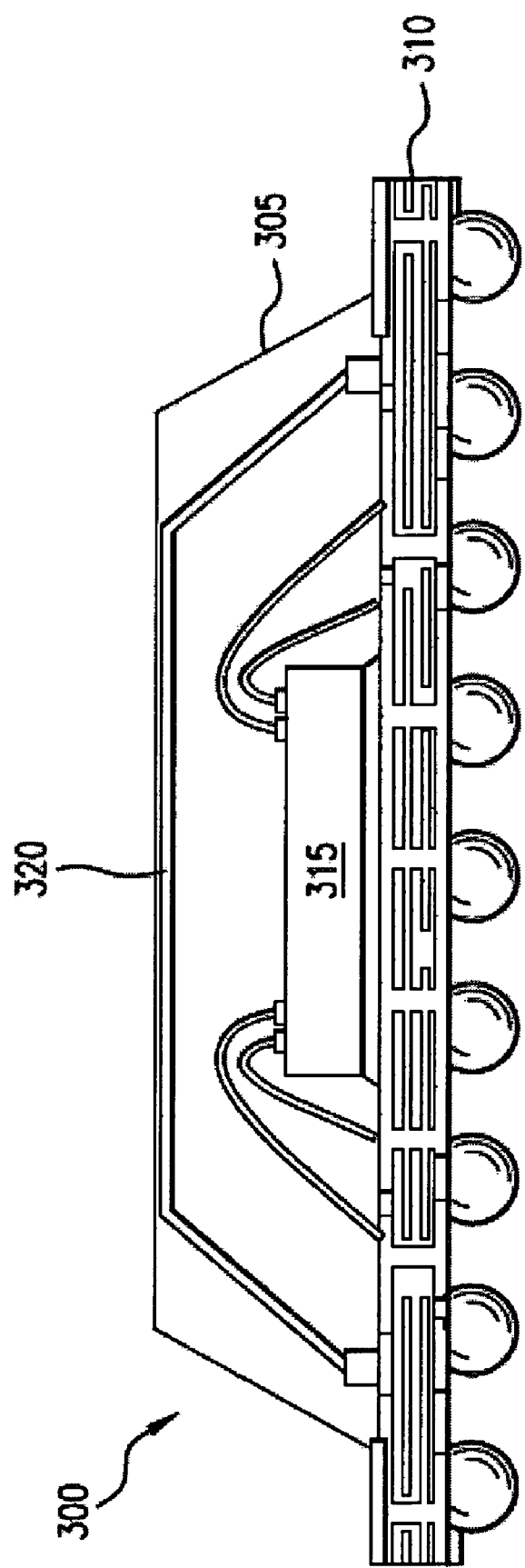

FIG. 3 illustrates a cross-sectional view of a conventional BGA package 300, similar to BGA package 200, but with a differently configured heat spreader 320. (See, e.g. U.S. Pat. No. 6,552,428 "Semiconductor Package Having An Exposed Heat Spreader" to Huang et al.). BGA package 300 suffers from the same thermal and electromagnetic shielding deficiencies as BGA package 200. A plastic molding compound 305 and a printed circuit substrate 310 trap heat generated by an IC die 315 within BGA package 300, and EMI generated inside and outside of BGA package 300 can penetrate printed circuit substrate 310.

Figure 4:
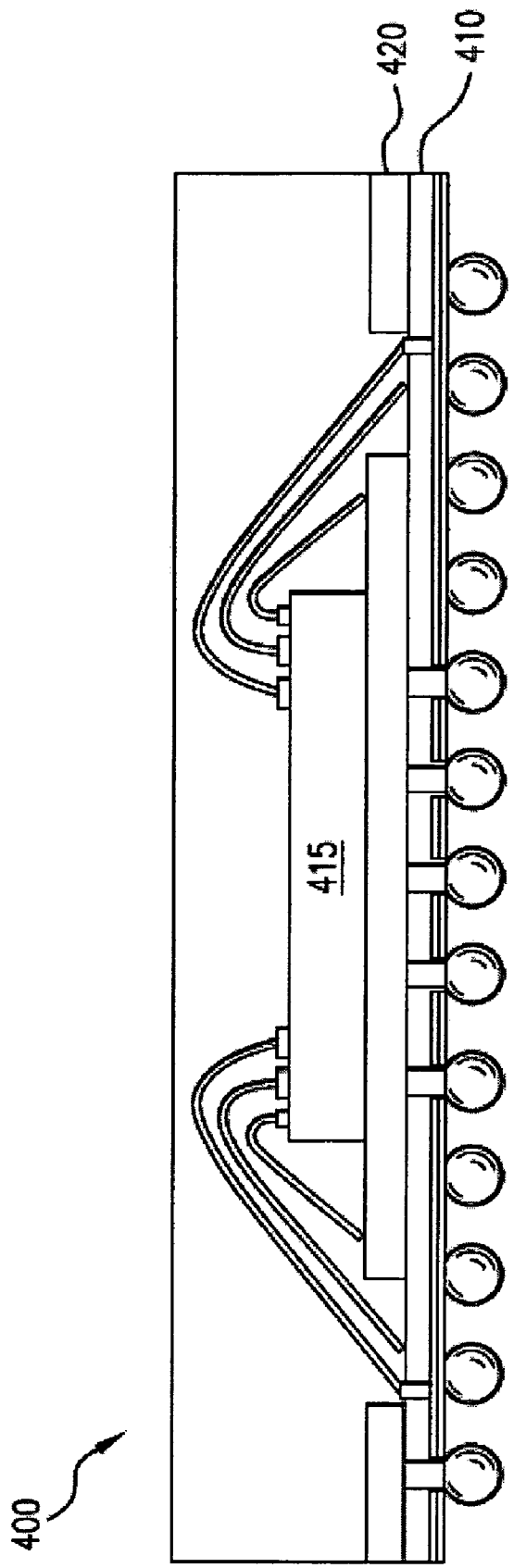
FIGS. 4 and 5 illustrate cross-sectional views of conventional BGA packages with enhanced thermal properties.
Figure 5:
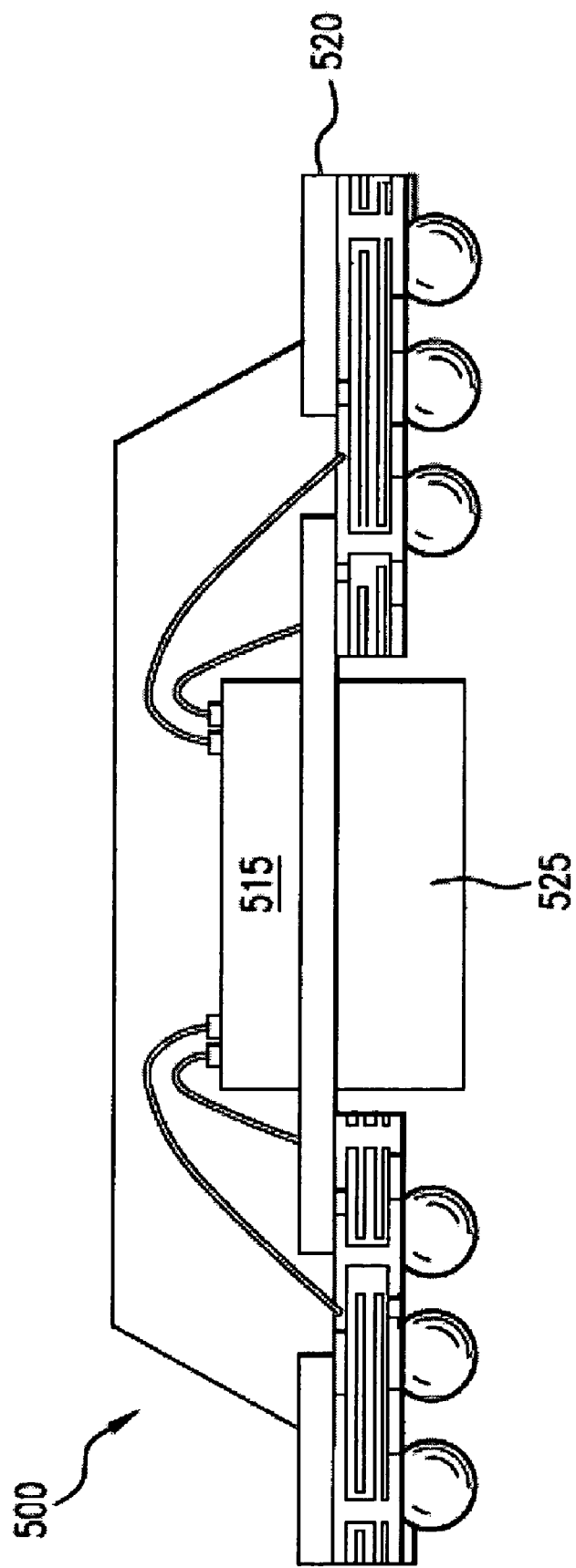

FIGS. 4 and 5 illustrate cross-sectional views of further conventional BGA packages. For example, FIG. 4 illustrates a BGA package 400 with a metal stiffener 420 that has a larger surface area than an IC die 415 to promote heat dissipation into surrounding materials. ("Ball Grid Array Package Enhanced With A Thermal And Electrical Connector," U.S. patent application Ser. No. 10/284,312, filed Oct. 31, 2002). Metal stiffener 420 is attached to an organic substrate 410, such as a polyimide tape or resin epoxy substrate.

FIG. 5 illustrates a cross-sectional view of a BGA package 500, which provides a thermal and electrical connection between an IC die 515 and a printed circuit board (PCB) (not shown) through a metal heat slug 525. (See, e.g. U.S. patent application Ser. No. 10/284,312 "Ball Grid Array Package Enhanced With A Thermal And Electrical Connector" to Zhao et al., which is herein incorporated by reference). IC die 515 is directly attached to a top surface of a metal stiffener 520. Metal heat slug 525 is attached to a bottom surface of metal stiffener 520 and has a surface that is configured to be mounted to the PCB. BGA package 500 promotes heat dissipation from IC die 515 to the PCB, on which BGA package 500 is mounted.

Metal stiffeners 420 and 520 of BGA packages 400 and 500, respectively, shield EMI radiating toward IC dies 415 and 515 from the area underneath the IC dies. However, BGA packages 400 and 500 do not shield EMI radiating towards IC dies 415 and 515 from the area above the active surface of the IC dies. BGA packages 400 and 500 also do not prevent EMI emanating from IC dies 415 and 515 from escaping the package through the area above the active surface of the IC dies.

Cap Structure for Heat Spreading and EMI Shielding

Figure 6A:
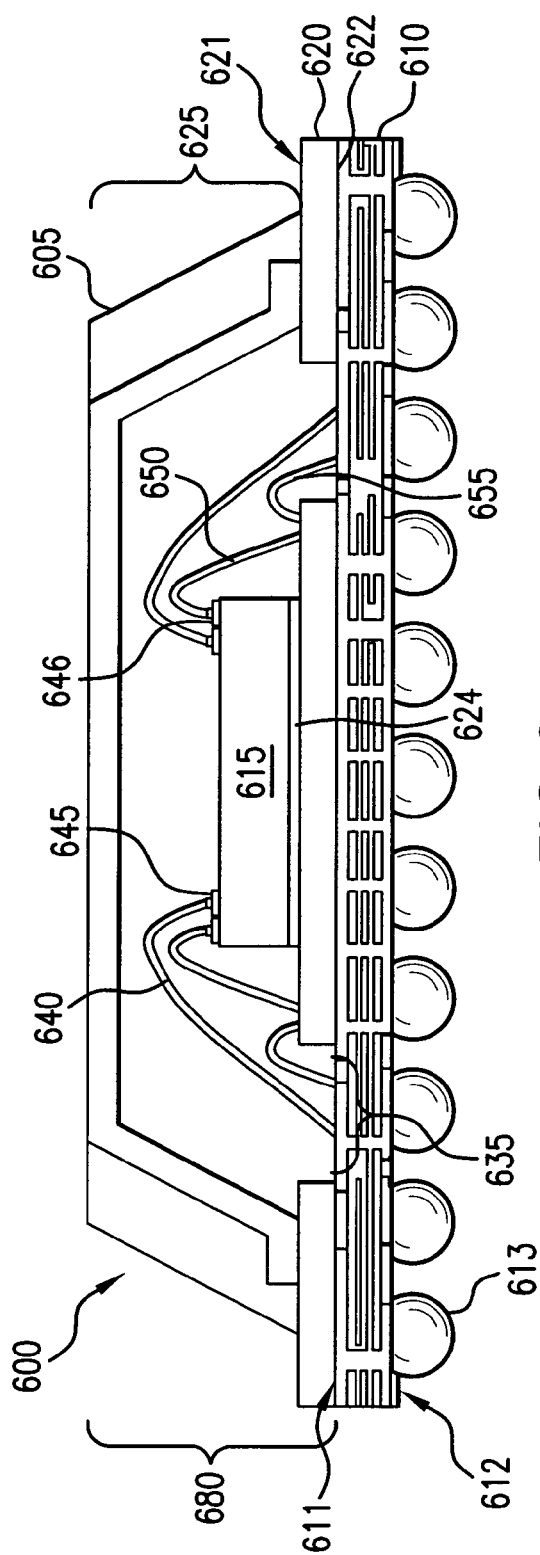
FIG. 6A illustrates a cross-sectional view of a die-up BGA package, in accordance with an embodiment of the present invention, having a cap structure integrated with a stiffener.

FIG. 6A illustrates a cross-sectional view of a die-up BGA package 600, in accordance with an embodiment of the present invention. BGA package 600 provides for enhanced heat spreading and EMI shielding. BGA package 600 includes a printed circuit substrate 610, a stiffener 620, and a cap body 625. An IC die 615 is mounted to a center region of a first surface 621 of stiffener 620 with a die attach material 624, such as an epoxy or solder. Cap body 625 is coupled to first surface 621 of stiffener 620, forming a die enclosure 680 that substantially surrounds IC die 615. A second surface 622 of stiffener 620 is attached to a first surface 611 of substrate 610. A plurality of solder balls 613 is coupled to a second surface 612 of substrate 610. Solder balls 613 are reflowed to attach package 600 to a PCB BGA package 600 further includes openings 635, wire bonds 640, 650, and 655, and mold compound 605. Openings 635 formed in stiffener 620 facilitate interconnection of one or more wire bonds 640 between corresponding pads 645 on IC die 615 and substrate 610. Pads 645 can be any type of signal pads of IC die 615, including I/O pads, voltage pads, ground pads, etc. Openings 635 also facilitate interconnection of one or more wire bonds 655 between stiffener 620 and substrate 610 (e.g., traces, contacts, ground rings, ground planes, voltage planes, etc. of substrate 610). One or more wire bonds 650 couple corresponding pads 646 on IC die 615 to stiffener 620. Pads 646 can be any type of signal pads of IC die 615, such as I/O pads, voltage pads, ground pads, etc. A mold compound 605 encapsulates IC die 615 and wire bonds 640, 650, and 655.

Figure 6B:
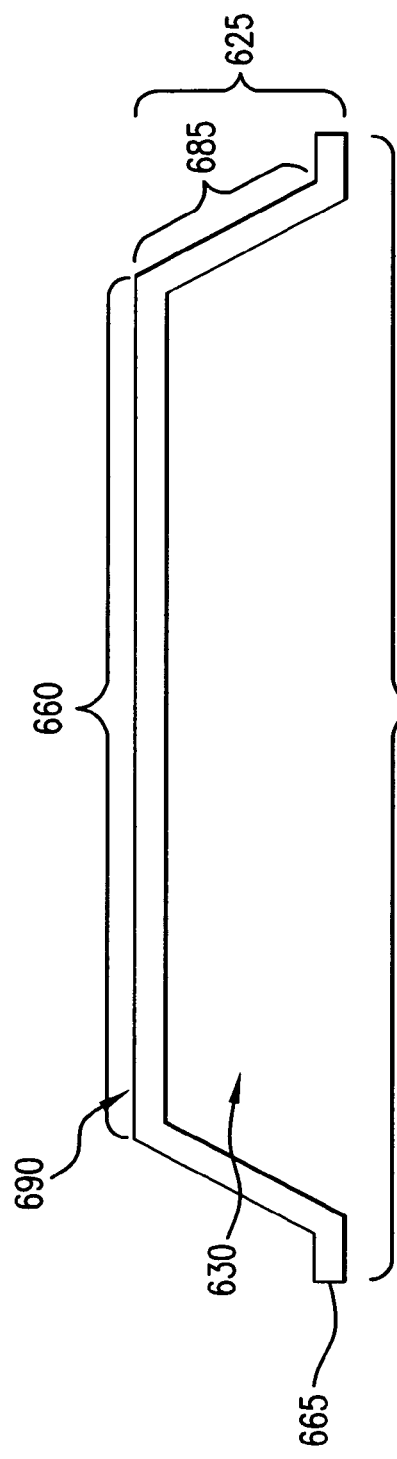
FIG. 6B illustrates the cap structure of FIG. 6A, in accordance with an embodiment of the present invention.

FIG. 6B illustrates a cross-sectional view of cap body 625, shown in FIG. 6A, in accordance with an embodiment of the present invention. In this embodiment, cap body 625 has a planar top portion 660, planar sidewall portions 685, and a rim 665 extending around a bottom periphery of cap body 625. Sidewall portions 685 couple top portion 660 to rim 665, and are angled outward from top portion 660. In FIG. 6B, top portion 660 and sidewall surfaces 685 are shown as planar but can also be non-planar (e.g., curved, or other shapes).

Cap body 625 further has a first surface 690 and a second surface 691. A portion of first surface 690 is exposed through mold compound 605, as shown in FIG. 6A. Second surface 691 has cavity 630 formed therein. Cavity 630 is shown in FIG. 6B as having a trapezoidal shaped cross-section, but can have other shapes, including rectangular, etc. Second surface 691 of cap body 625 (at rim 665) is coupled to stiffener 620, as shown in FIG. 6A.

Example materials for substrate 610 include organic (e.g., BT, FR4, etc.), ceramic, glass, tape, and other materials. Substrate 610 can have one or more electrical routing layers, which are constructed through lamination, build-up, or other processes.

Example materials for stiffener 620 and cap body 625 include copper, aluminum, aluminum based alloys, copper based alloys, ferromagnetic materials, laminated copper/iron, other metals and combinations of metals/alloys, other thermally and electrically conductive materials (e.g., ceramics, metallized plastics, etc.), and other materials described elsewhere herein. Stiffener 620 and cap body 625 can be made of the same material or different materials. Stiffener 620 can have any thickness, depending on the particular application. For example, in embodiments, stiffener 620 can have a thickness anywhere in the range of 0.01 mm to 10 mm. In an example embodiment, stiffener 620 can have a thickness in the range of about 0.1 mm to about 0.5 mm. In another example embodiment, stiffener 620 can have a thickness of about 1.17 mm. Similarly, cap body 625 can have any thickness, depending on the particular application. For example, in embodiments, cap body 625 can have a thickness anywhere in the range of 0.01 mm to 10 mm. In an example embodiment, cap body can have a thickness in the range of about 0.1 mm to about 1.0 mm.

In embodiments, surfaces of stiffener 620 can be finished or un-finished. For instance, surfaces of stiffener 620 can be finished using processes such as micro-etch or oxidation to promote adhesion with mold compound 605. For example, first surface 621 of stiffener 620 can be patterned (e.g. spot, strip, bar, ring, other shapes) with one or more electrically conductive plated areas (e.g., silver, solder, nickel, gold, metal combinations/alloys, etc.) for enhanced coupling of wire bonds 650 to first surface 621. Stiffener 620 can also be patterned in various forms to improve package mechanical, thermal, and electrical performances and package reliability. (See, e.g. U.S. patent application Ser. No. 10/284,312 "Ball Grid Array Package Enhanced With A Thermal And Electrical Connector" to Zhao et al., which is herein incorporated by reference). For example, notches/cutouts and steps (not shown) can be patterned on the edges of stiffener 620 to reduce a length of wire bond 640 between IC die 615 and substrate 610, improve substrate 610 routability, and improve manufacturing processes.

Electrical Coupling of the Cap Structure to the Stiffener

When stiffener 620 and cap body 625 are coupled together, as shown in FIG. 6A, die enclosure 680 is formed. Die enclosure 680 shields EMI emanating from IC die 615, as well as EMI radiating toward IC die 615 from outside package 600. In order to provide enhanced EMI protection, die enclosure 680 can be coupled to a ground potential (e.g., to create a Faraday cage), or to other electrical potentials (i.e., to create a voltage plane). When stiffener 620 is coupled with ground pads 646 (or bond pads of other electrical potentials) on IC die 615, die enclosure 680 operates as a ground potential (or other electrical potential) plane for IC die 615. Furthermore, this ground potential plane can be externally accessed at first surface 690 of top portion 660 of cap body 625, if desired.

To enhance electrical contact (i.e., reduce the electrical resistance) between stiffener 620 and cap body 625, electrically conductive adhesives, such as epoxy filled with silver particles or flakes, can be used to couple cap body 625 to stiffener 620. Soldering materials, such as tin-lead or silver, can also be used to couple cap body 625 to stiffener 620 through processes such as solder plating and reflow or screen printing of paste and reflow. Additionally or alternatively, thermally conductive adhesives (including electrically and thermally conductive adhesives) can be used to enhance thermal contact between cap body 625 and stiffener 620.

FIGS. 7A-7C show example configurations for stiffener 620, according to embodiments of the present invention. Thermally and/or electrically conductive materials (e.g., silver, solder, nickel, gold, metal combinations/alloys, etc.) can be selectively plated or screen-printed on first surface 621 of stiffener 620 to enhance electrical contact with cap body 625. For example, FIG. 7A illustrates a top view of a one-piece stiffener 702 with a plurality of wire bond openings 705 and a plated ring-shaped area 710. As shown in FIG. 7A, wire bond openings 705 can be trapezoidal shaped, although openings 705 can have other shapes, including rectangular, oval, etc. Ring area 710 is plated with an electrically conductive material to enhance electrical contact with cap body 625.

FIG. 7B illustrates a top view of a one-piece stiffener 704 with a trapezoidal wire bond opening 705, multiple cutouts 725, and plated areas 730, 735, and 740. Cutouts 725 are recessed edge portions of stiffener 620. Cutouts 725 can be used to allow wire bond connections between an IC die and a package substrate in the areas of cutouts 725. Areas 730, 735, and 740 are plated with an electrically conductive material. Area 730 has an elongated strip shape, area 735 is circular, and area 740 is rectangular. Note that plated areas can have alternative shapes and/or sizes. Areas 730, 735, and 740 can be used to enhance electrical contact with cap body 625.

FIG. 7C illustrates a top view of a two-piece stiffener 706, with a first stiffener portion 765 separated by a channel 755 from a second stiffener portion 760. Two-piece stiffener 706 of FIG. 7C includes wire bond openings 750, 751, and 752, through first stiffener portion 765. A plated U-shaped area 770 is patterned on first stiffener portion 765. As shown in FIG. 7C, wire bond openings 750, 751, and 752 can be rectangular shaped, although, openings 750, 751, and 752 can have other shapes (e.g., trapezoidal, etc.). U-shaped area 770 is plated with an electrically conductive material to enhance electrical contact with cap body 625.

In FIG. 7C, second stiffener portion 760 is electrically isolated from first stiffener portion 765 by channel 755. In an embodiment, second stiffener portion 760 is also electrically isolated from cap body 625 (when attached to stiffener 620) because cap body 625 is not electrically coupled to second stiffener portion 760. For example, a non-electrically conductive adhesive may couple second stiffener portion 760 and cap body 625. Thus, second stiffener portion 760 can be coupled to a different potential from first stiffener portion 765, if desired.

The invention is not, however, limited to the example stiffener configurations shown in FIGS. 7A-7C. Based on the teachings herein, one skilled in the relevant art(s) will understand that the invention can be implemented with other stiffener configurations having differently shaped wire bond openings/cutouts (e.g., circular openings, rectangular cutouts, etc.), differently shaped electrically conductive plated areas (e.g., circular ring-shaped area, or other shapes), and different quantities of wire bond openings/cutouts and electrically conductive plated areas.

Structural Coupling of the Cap Structure to the Stiffener

When stiffener 620 and cap body 625 are coupled together, as shown in FIG. 6A, die enclosure 680 is formed, which provides enhanced structural integrity and environmental protection. FIGS. 8A and 8B illustrate an example configuration of a cap body 805, in accordance with an embodiment of the present invention. Cap body 805 is configured to enhance structural interlocking with a stiffener.

FIG. 8A illustrates a cross-sectional view of cap body 805 having a rim 810. FIG. 8B illustrates a bottom view of cap body 805. The bottom surface of rim 810 is patterned with one or more protruding tab members (e.g., through stamping or other metal forming process). For example, shown in FIGS. 8A and 8B are frustum-shaped tab 815, conical-shaped tabs 820, conical-shaped tab 825, and oblong-shaped tab 830. The invention is not, however, limited to the example tab quantities, shapes, and sizes shown in FIGS. 8A and 8B. For example, a cap body can have more or fewer numbers of tabs patterned on the bottom surface, the tabs can have the same shape or different shapes (e.g., conical, frustum, oblong, or other shapes), and the tabs can have the same size or different sizes (e.g., diameter, height, depth, etc.).

Note that a cap body (such as cap body 625 or 805) can have various shapes. For example, as shown in FIG. 8B, cap body 805 can be round. Alternatively, a cap body can have other shapes, including rectangular (e.g., square), elliptical, oval, or any other shape.

FIGS. 9A-9C show example stiffener configurations, according to embodiments of the present invention. FIG. 9A illustrates a top view of a stiffener 950 with a plurality of wire bond openings 912 and a plurality of receptacles 902, 904, 906, 908, and 910 formed in the top surface. Receptacles 902 and 904 are circular-shaped indentations, and indentation 902 has a larger diameter than indentation 904. Receptacle 906 is a circular-shaped opening, and receptacle 908 is a rectangular-shaped opening. Receptacle 910 is a rectangular-shaped edge (e.g., corner) cutout. Receptacles 902, 904, 906, 908, and 910 are configured to be coupled with corresponding tabs patterned on the bottom surface of a cap body to strengthen structural coupling of the cap body to the stiffener. For example, receptacles 902 may have conical cross-sections, etc.

FIG. 9B illustrates a top view of a stiffener 960 with a wire bond opening 928, a plurality of wire bond cutouts 930, and receptacles 920, 922, 924, and 926 formed in the top surface. Receptacles 920 are circular-shaped openings, receptacle 922 is a circular-shaped opening with a larger diameter than receptacles 920, and receptacle 924 is a rectangular-shaped opening. Receptacle 926 is a rectangular-shaped edge (e.g., corner) cutout. Receptacles 920, 922, 924, and 926 are configured to be coupled with corresponding tabs patterned on the bottom surface of a cap body to strengthen structural coupling of the cap body to the stiffener.

FIG. 9C illustrates a top view of a stiffener 970 with a plurality of wire bond cutouts 938, and receptacles 930, 932, 934, and 936 formed in the top surface. Receptacles 930 are circular-shaped openings, receptacle 932 is a circular-shaped opening with a larger diameter than receptacles 930, and receptacle 934 is a rectangular-shaped opening. Receptacle 936 is a rectangular-shaped edge (e.g., corner) cutout. Receptacles 930, 932, 934, and 936 are configured to be coupled with corresponding tabs patterned on the bottom surface of a cap body to strengthen structural coupling of the cap body to the stiffener.

The receptacle configurations shown in the example stiffeners of FIGS. 9A-9C facilitate structural coupling of a cap body to the stiffener in a particular orientation. The invention is not, however, limited to the example receptacle quantities, locations, types, shapes, and sizes shown in FIGS. 9A-9C. For example, a stiffener can have more or fewer numbers of receptacles formed in the top surface, and in the same or in different locations than the example configurations shown in FIGS. 9A-9C. Also, the receptacles can be of the same type or of different types (e.g., opening, indentation, cutout, etc.), can have the same shape or different shapes (e.g., circular, rectangular, or other shapes), and can have the same size or different sizes (e.g., diameter, width, depth, etc.).

Figure 10:
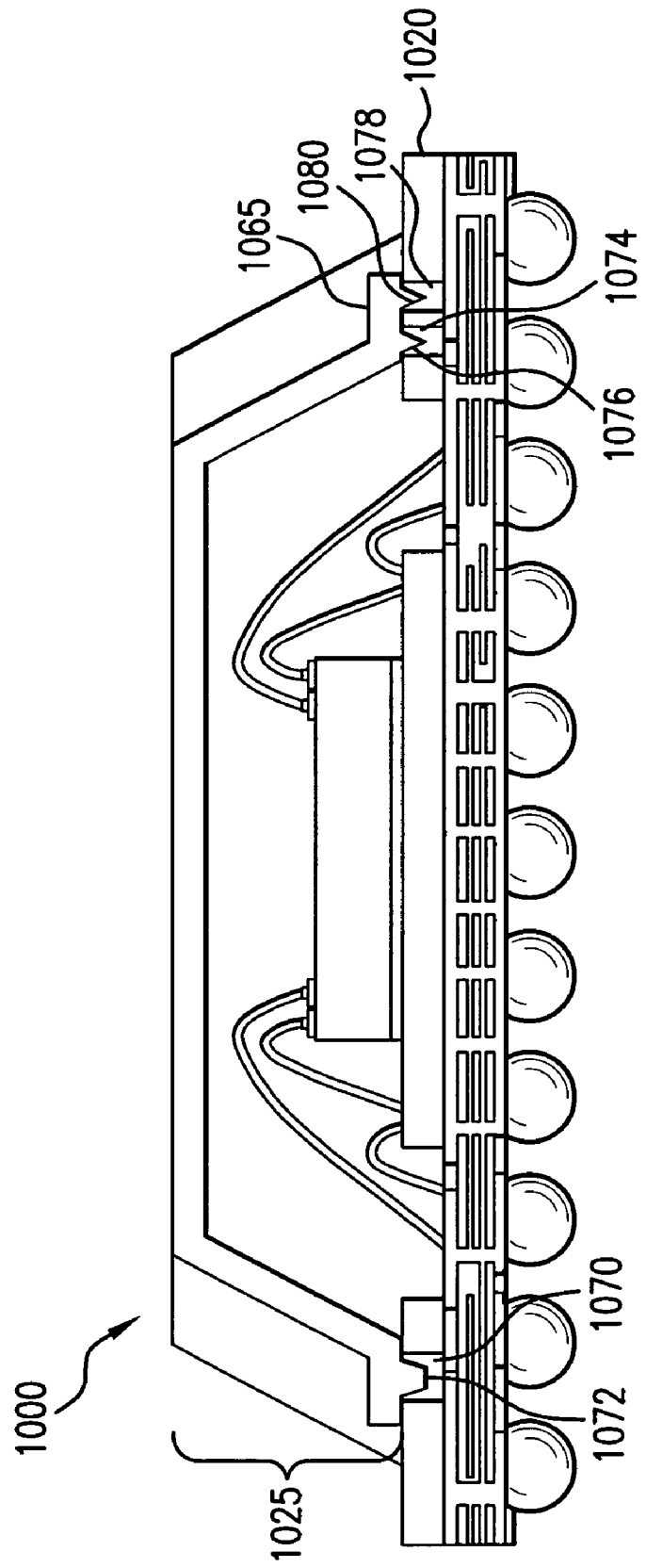
FIG. 10 illustrates a cross-sectional view of a BGA package, in accordance with an embodiment of the present invention, with a cap structure having tab members coupled with corresponding receptacles in a stiffener.

FIG. 10 illustrates a cross-sectional view of a BGA package 1000, in accordance with an example embodiment of the present invention. FIG. 10 shows receptacles 1070, 1074, and 1078 formed in a stiffener 1020. Receptacles 1070, 1074, and 1078 are configured to be coupled with corresponding tabs 1072, 1076, and 1080, respectively, patterned on a rim 1065 of a cap body 1025. This coupling helps to ensure tight lock-in of cap body 1025 with stiffener 1020. To further enhance coupling, electrically and/or thermally conductive adhesives (e.g., silver filled epoxy) can be deposited at receptacles 1070, 1074, and 1078 prior to attaching cap body 1025 to stiffener 1020. Additionally or alternatively, electrically and/or thermally conductive adhesives (e.g., silver filled epoxy) can be deposited at other areas on stiffener 1020 in contact with rim 1065.

Integrating a Encapsulating Material with the Die Enclosure

Integrating an encapsulating material, such as glob top or plastic molding compound, with the die enclosure, can enhance the structural rigidity of the BGA package and enhance the planarity of the package substrate. For example, the combination of the encapsulating material and the die enclosure can reduce IC die cracking, delamination and substrate warpage. Integrating the encapsulating material with the die enclosure also enhances environmental protection. For example, they can provide protection against mechanical stress, impact, vibration, chemical corrosives, moistures, heat exposure, radiation, etc. Additionally, attaching the IC die directly to the die enclosure adds mass to the die support and helps reduce microphonics caused by shock or vibrations Conventional IC die encapsulation processes can be used to integrate the encapsulating material with the die enclosure. For example, encapsulation techniques such as dam-and-fill (glob top), injection molding, strip or panel over-molding, saw-singulation, and any other IC die encapsulation processes can be used. Typical encapsulating materials, such as plastic molding compound, have low thermal conductivity (e.g., about 0.2 to 0.9 W/mK) and therefore create a bottleneck for heat spreading in conventional die-up array packages. In embodiments of the present invention, the die enclosure eliminates this bottleneck because it provides a thermally conductive path from the bottom surface of the IC die to the outer surfaces of the package. Example materials for die enclosures include copper, aluminum, aluminum based alloys, copper based alloys, ferromagnetic materials, laminated copper/iron, other metals and combinations of metals/alloys, other thermally and electrically conductive materials (e.g., ceramics, metallized plastics, etc.), and other materials described elsewhere herein. In embodiments, materials for the die enclosure have high thermal conductivity (e.g., approximately 390 W/mK for copper) and therefore promote heat spreading.

Figure 11:
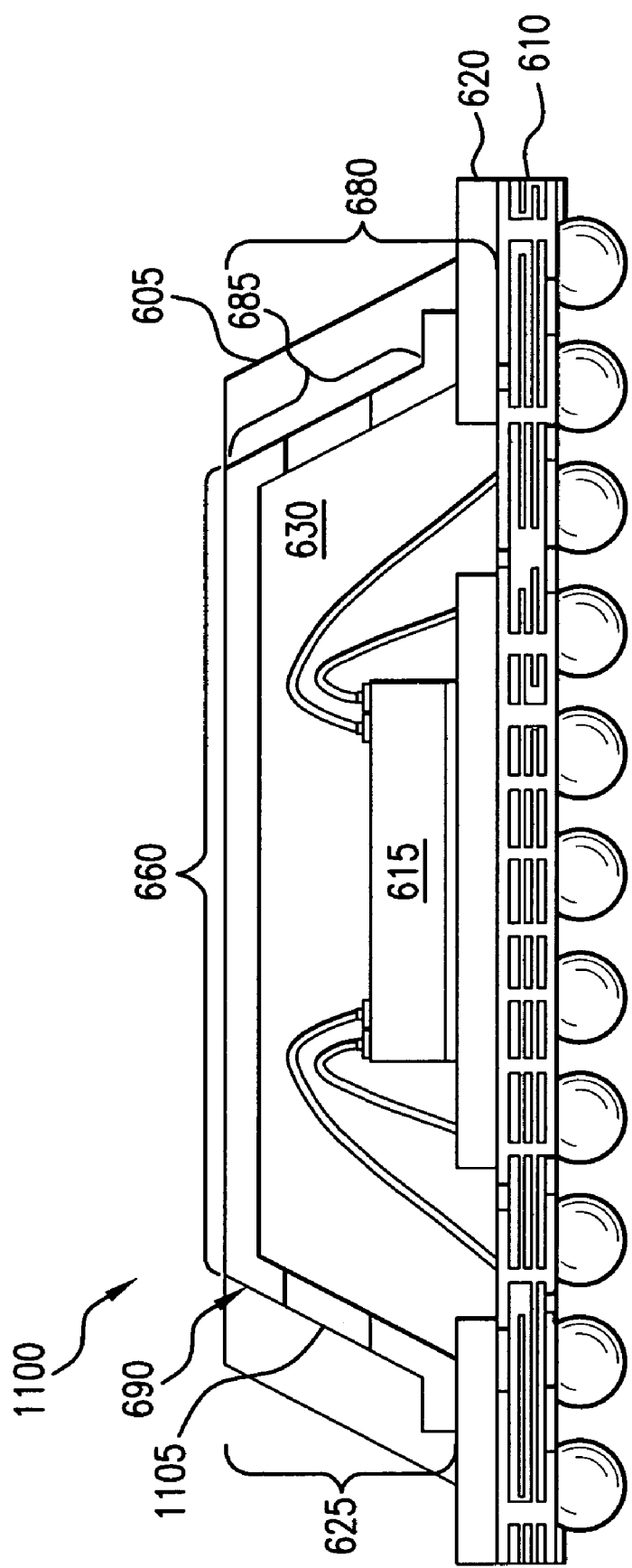
FIG. 11 illustrates a cross-sectional view of a BGA package, in accordance with an embodiment of the present invention, with mold gate openings through a cap structure, which has a surface not covered by an encapsulating material.

For example, FIG. 11 illustrates a cross-sectional view of a BGA package 1100, in accordance with an embodiment of the present invention. Package 1100 includes a cap structure having one or more mold gate openings and a surface that is exposed through an encapsulating material. In FIG. 11, cap body 625 has two mold gate openings 1105 through slanted sidewall portions 685. Mold gate openings 1105 enable mold compound 605 to flow or be injected into cavity 630. First surface 690 of top portion 660 of cap body 625 is exposed through mold compound 605 (e.g., not covered).

Figure 12:
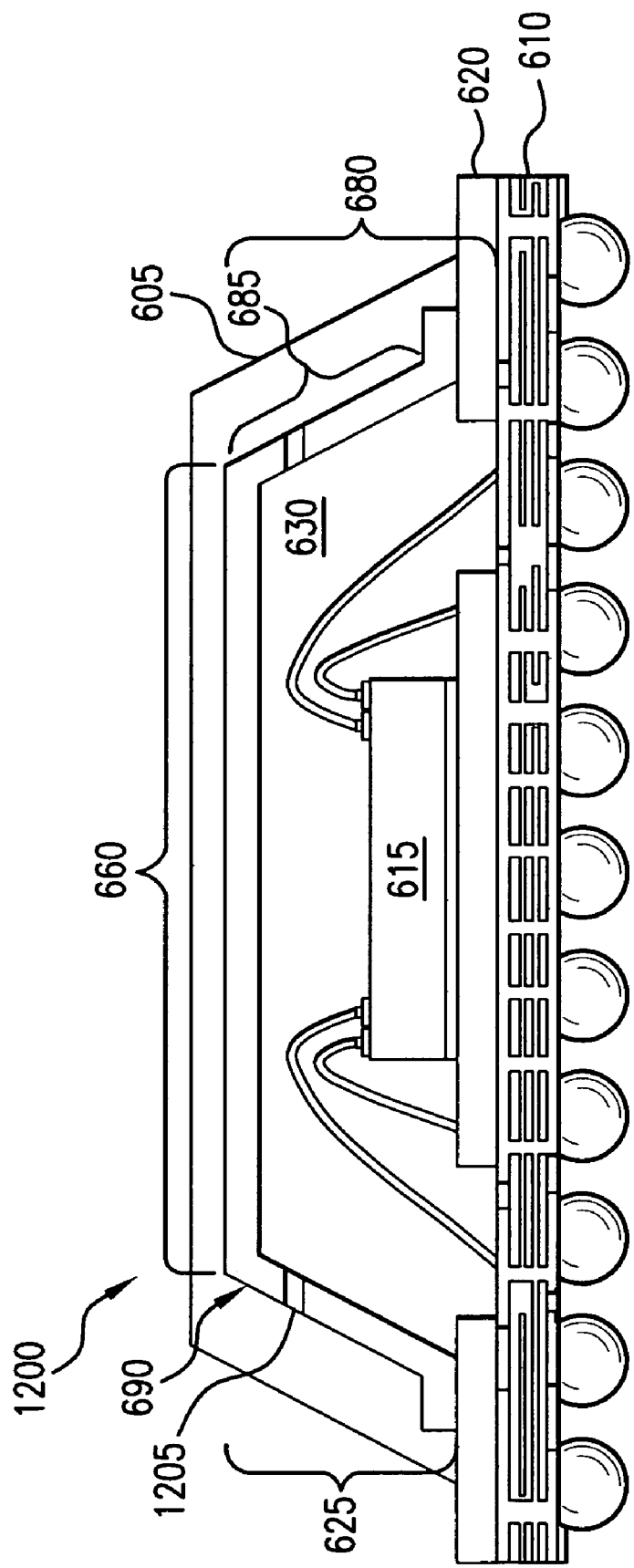
FIG. 12 illustrates a cross-sectional view of a BGA package, in accordance with an embodiment of the present invention, with mold gate openings through a cap structure, which is covered by an encapsulating material.

FIG. 12 illustrates a cross-sectional view of a BGA package 1200, in accordance with an embodiment of the present invention. Package 1200 has a cap structure with one or more mold gate openings. In FIG. 12, cap body 625 has two mold gate openings 1205 through slanted sidewall portions 685. Mold gate openings 1205 enable mold compound 605 to flow or be injected into cavity 630. Furthermore, as opposed to the configuration shown in FIG. 11, first surface 690 of cap body 625 is entirely covered by mold compound 605.

Figure 13:
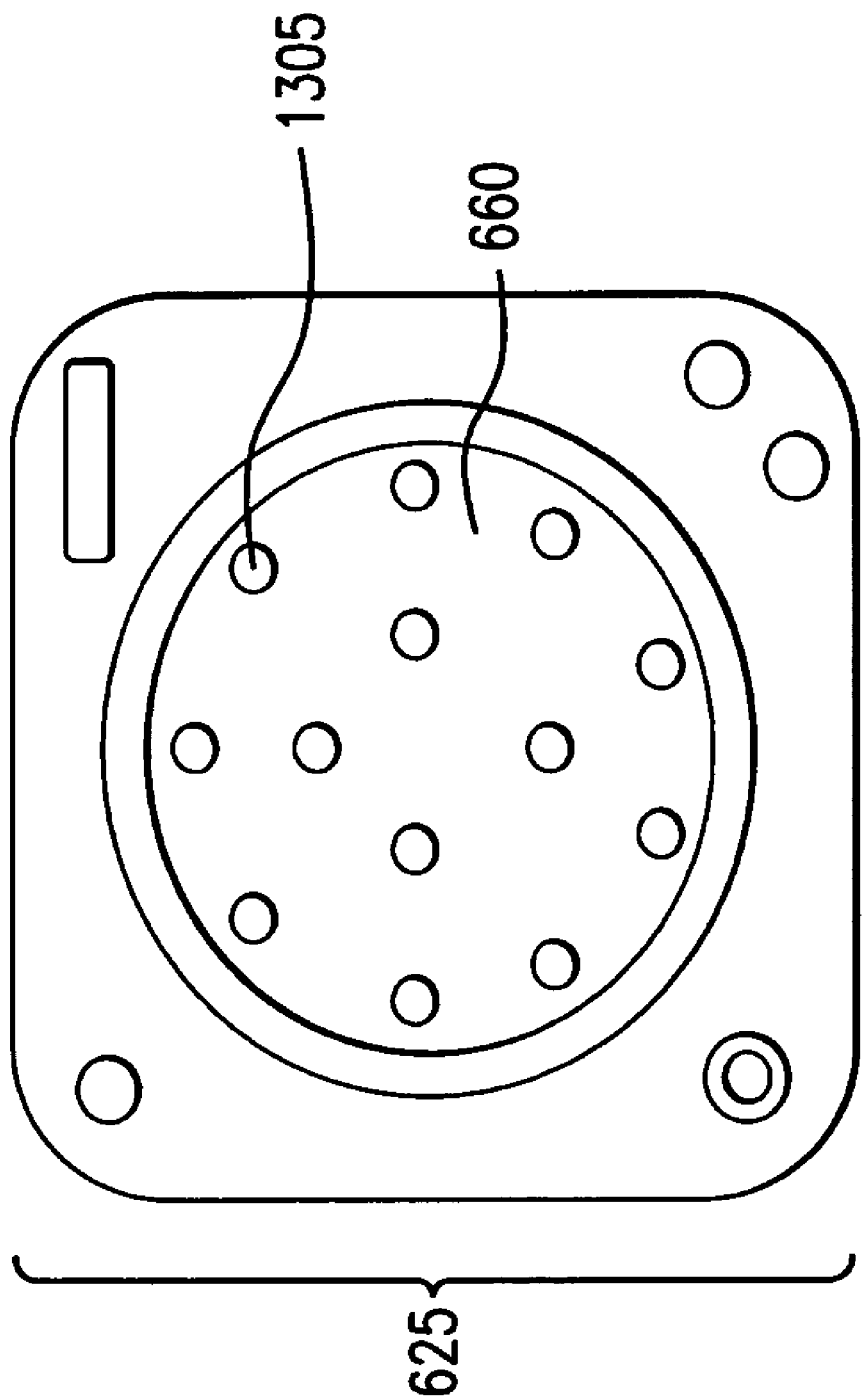
FIG. 13 illustrates a bottom view of a cap structure, in accordance with an embodiment of the present invention, with mold gate openings through a surface.

FIG. 13 illustrates a bottom view of cap body 625, in accordance with an embodiment of the present invention. In FIG. 13, cap body 625 has a plurality of circular mold gate openings 1305 through top portion 660. Referring to FIGS. 11 and 12, as the diameter of cavity 630 increases, higher pressure is required to facilitate flow or injection of mold compound 605 through mold gate openings 1105 and 1205, respectively, into the area of cavity 630, above the active surface of IC die 615. Advantageously, mold gate openings 1305, enable flow of mold compound 605 into the area of cavity 630, above the active surface of IC die 615, without requiring higher pressure because they are located above the active surface of IC die 615. Note that in embodiments, a diameter of mold gate openings should be selected to limit passage of EMI; however, the smaller the diameter, the higher the pressure required for injection molding. Mold gate opening diameter can be, for example, in the range of about 0.5 mm to about 3 mm (e.g., a diameter of about 1.5 mm can shield EMI having highest harmonic frequencies of up to 10 GHz), and can also be outside of this range depending on the particular application.

Figure 14:
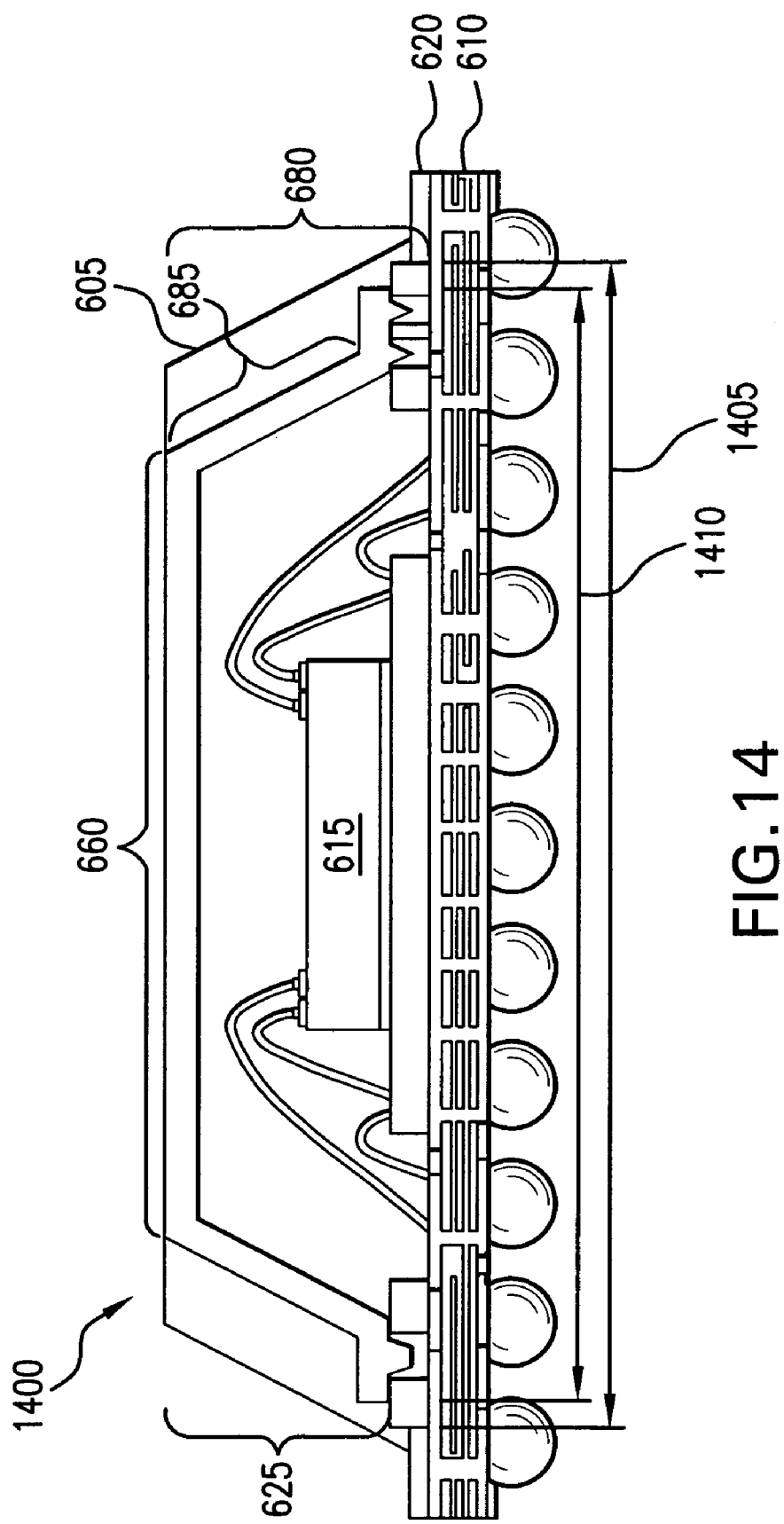
FIG. 14 illustrates a cross-sectional view of a BGA package, in accordance with an embodiment of the present invention, with an encapsulating material covering a stiffener, which has a peripheral dimension that exceeds a peripheral dimension of a cap structure.

FIG. 14 illustrates a cross-sectional view of a BGA package 1400, in accordance with an embodiment of the present invention. In FIG. 14, mold compound 605 covers stiffener 620, and a peripheral dimension 1405 of stiffener 620 exceeds a peripheral dimension 1410 of cap body 625. Peripheral dimension 1405 of stiffener 620 can exceed (as shown in FIG. 14), be equal to (as shown in FIGS. 17 and 18, described below), or be less than (not shown) peripheral dimension 1410 of cap body 625.

Figure 15:
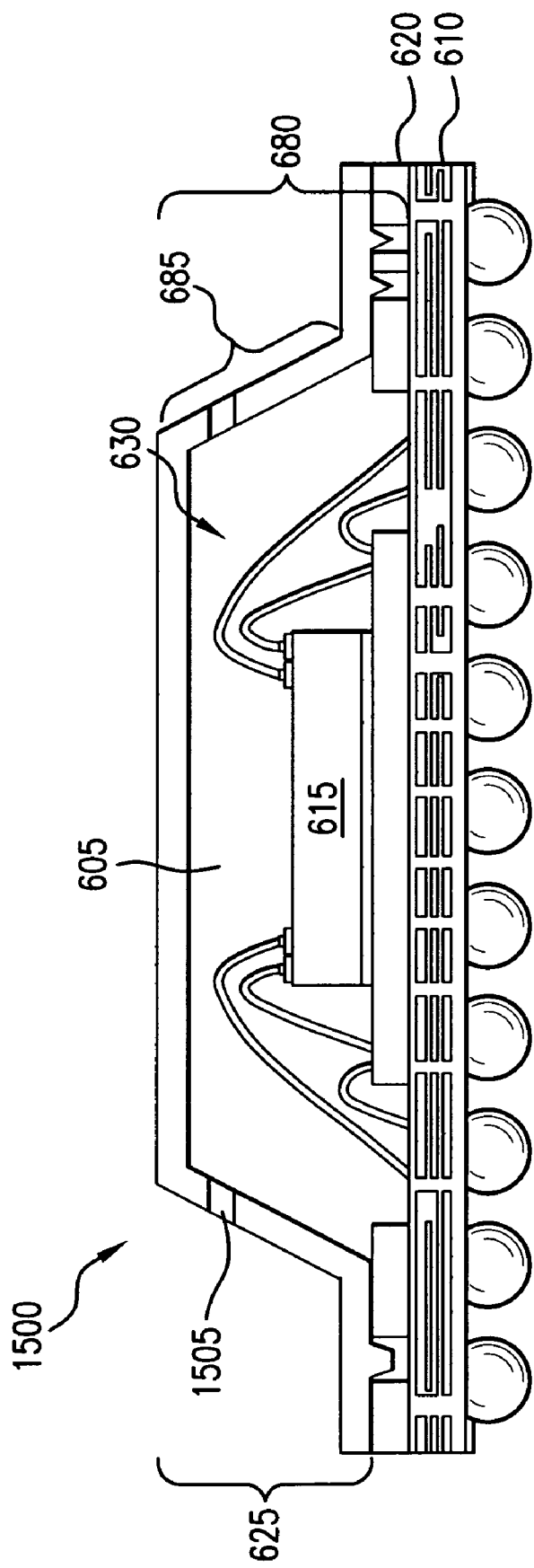
FIG. 15 illustrates a cross-sectional view of a BGA package, in accordance with an embodiment of the present invention, with a die that is encapsulated by mold injection encapsulation.

FIG. 15 illustrates a cross-sectional view of a BGA package 1500, in accordance with an embodiment of the present invention. In FIG. 15, cap body 625 is attached to stiffener 620 before encapsulating IC die 615. Mold gate openings 1505 through sidewall portions 685 of cap body 625 facilitate injection of mold compound 605 into cavity 630.

Figure 16:
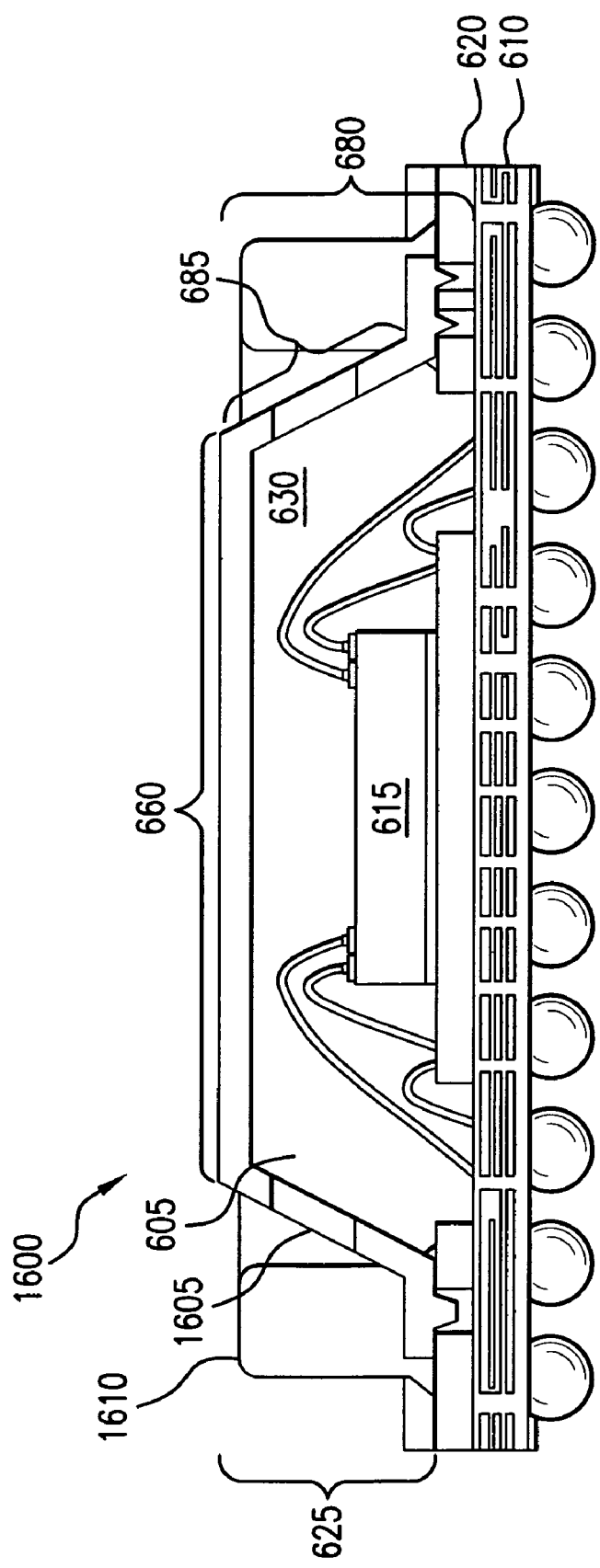
FIG. 16 illustrates a cross-sectional view of a BGA package, in accordance with an embodiment of the present invention, with a die that is encapsulated by dam-and-fill encapsulation.

FIG. 16 illustrates a cross-sectional view of a BGA package 1600, in accordance with an embodiment of the present invention. In FIG. 16, after attaching cap body 625 to stiffener 620, a dam 1610 is applied to stiffener 620 and/or rim 665 around the periphery of cap body 625. Mold compound 605 is deposited bewteen dam 1610 and cap body 625, and flows into cavity 630 through mold gate openings 1605. In the example of FIG. 16, first surface 690 of top portion 660 of cap body 625 is exposed through mold compound 605 (e.g., not covered).

Figure 17:
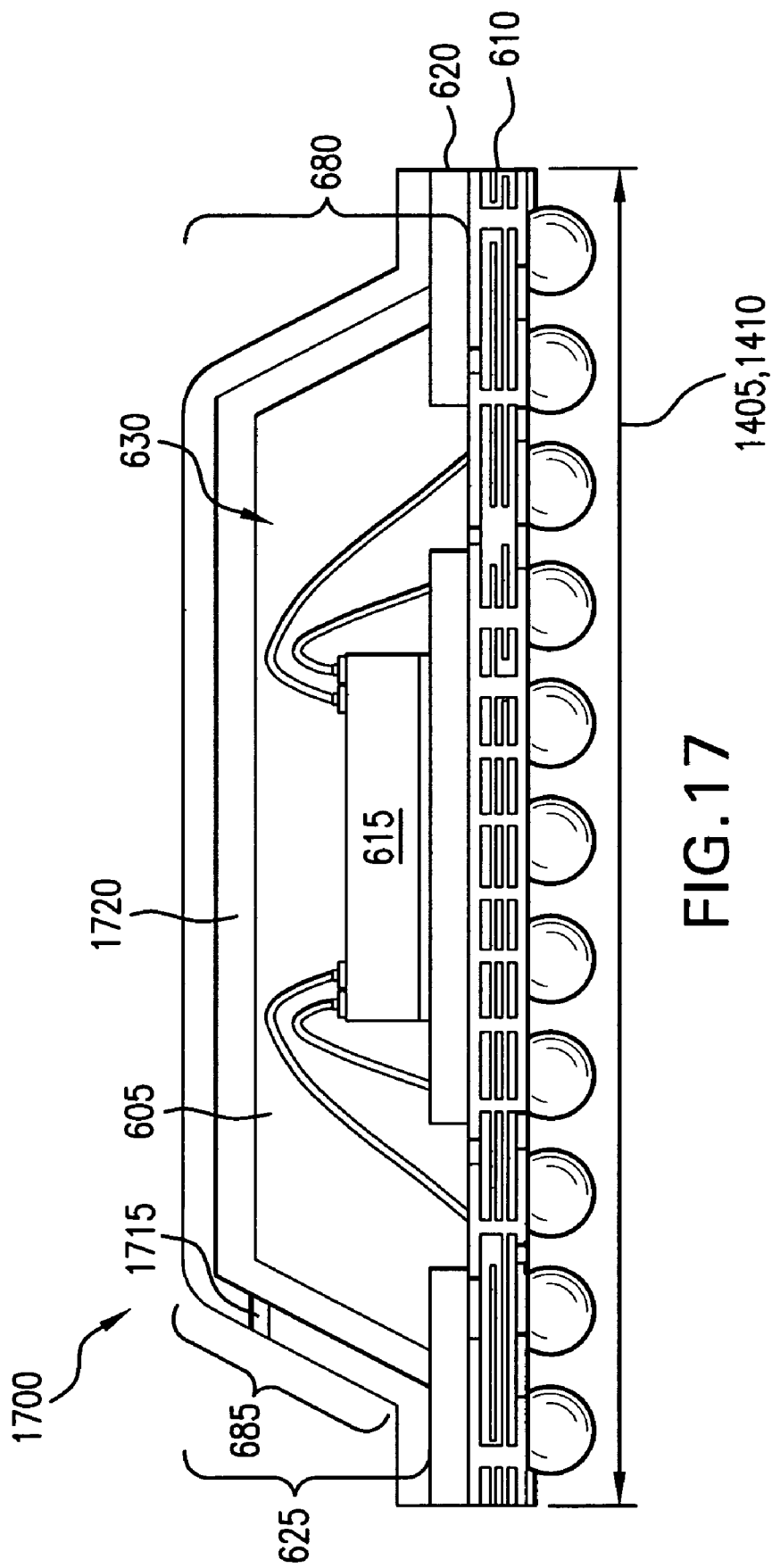
FIG. 17 illustrates a cross-sectional view of a BGA package, in accordance with an embodiment of the present invention, having a die encapsulated by mold injection encapsulation and a pressure release opening through a cap structure.
Figure 18:
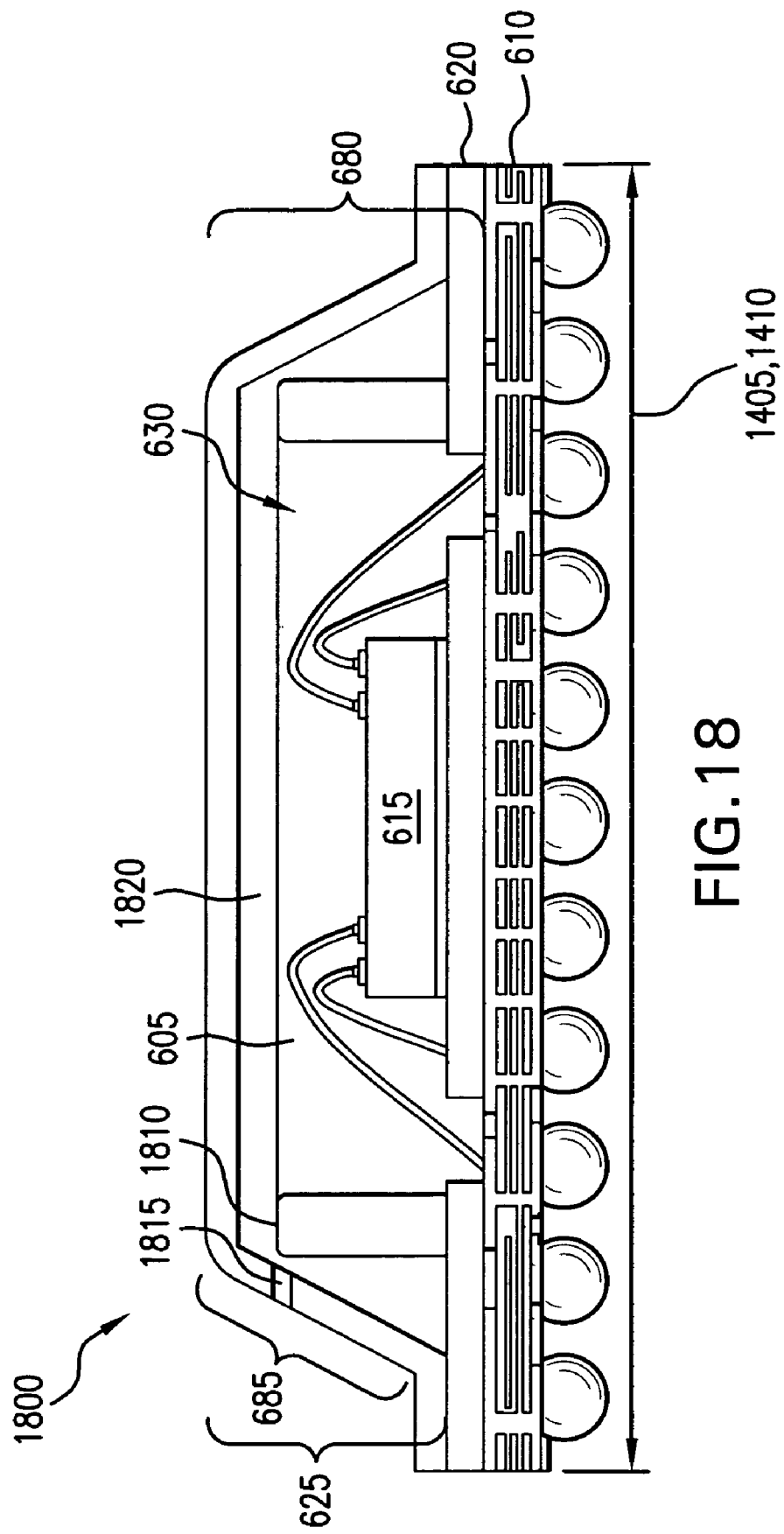
FIG. 18 illustrates a cross-sectional view of a BGA package, in accordance with an embodiment of the present invention, having a die encapsulated by dam-and-fill encapsulation and a pressure release opening through a cap structure.

FIG. 17 illustrates a cross-sectional view of a BGA package 1700, in accordance with an embodiment of the present invention. In FIG. 17, cap body 625 is attached to stiffener 620 after encapsulating IC die 615 (such as by a mold injection encapsulation process). Thus, an air gap 1720 exists between cap body 625 and mold compound 605 in cavity 630. Pressure within cavity 630 due to air gap 1720 can build up at elevated temperatures during assembly, qualification, and testing of BGA package 1700. A pressure release opening 1715 through sidewall portion 685 of cap body 625 allows gas, which is released from the materials within cavity 630, to escape from air gap 1720 and balance cavity pressure with the ambient pressure.

FIG. 18 illustrates a cross-sectional view of a BGA package 1800, in accordance with an embodiment of the present invention. In FIG. 18, mold compound 605 is deposited within a dam 1810, around IC die 615, using a dam-and-fill encapsulation process. Subsequently, cap body 625 is attached to stiffener 620. Thus, an air gap 1820 exists between cap body 625 and mold compound 605 in cavity 630. A pressure release opening 1815 through sidewall portion 685 of cap body 625 allows gas, which is released from the materials within cavity 630, to escape from air gap 1820 and balance cavity pressure with the ambient pressure.

Figure 19:
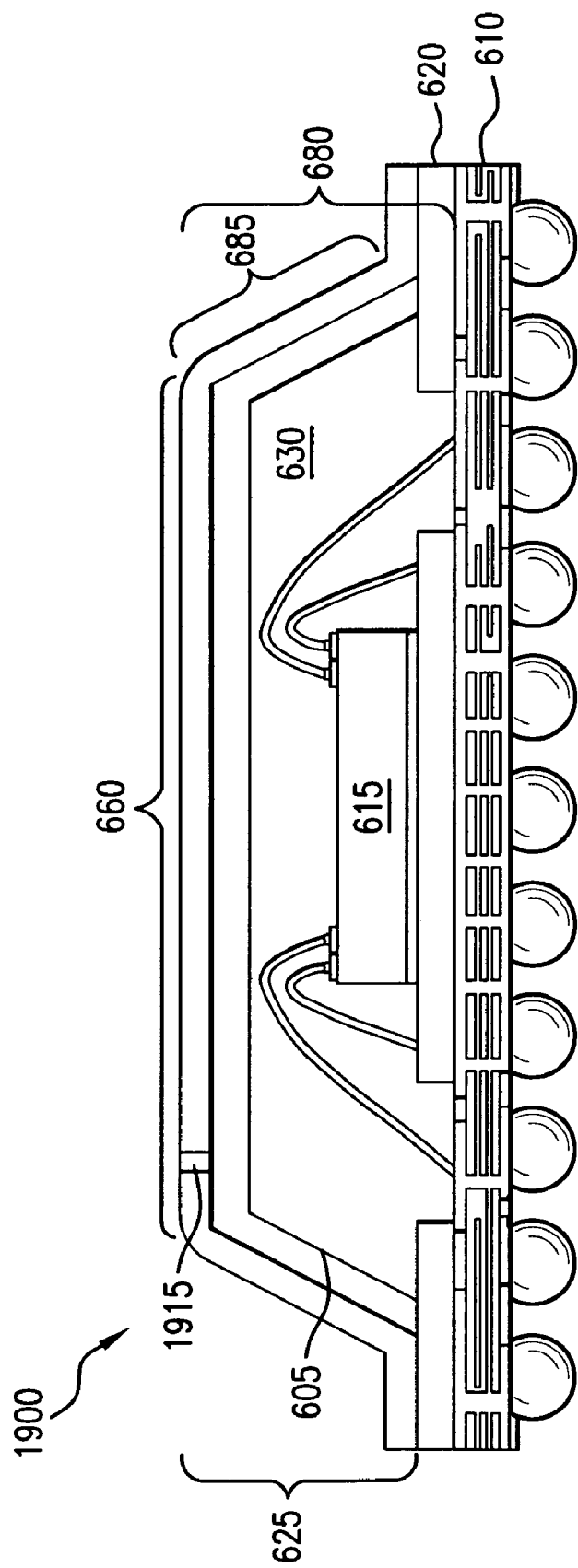
FIG. 19 illustrates a cross-sectional view of a BGA package, in accordance with an embodiment of the present invention, having a cap structure with a pressure release opening.

FIG. 19 illustrates a cross-sectional view of a BGA package 1900, in accordance with an embodiment of the present invention. In FIG. 19, a pressure release opening 1915 is formed through top portion 660 of cap body 625. In embodiments, a diameter of pressure release opening 1915 is selected to limit passage of EMI. The diameter of pressure release opening 1915 can be, for example, in the range of about 0.2 mm to about 2 mm (e.g., a diameter of about 0.5 mm can shield EMI having highest harmonic frequencies of up to 30 GHz), and can also be outside of this range, depending on the particular application. The diameter need not meet mold gate opening diameter requirements, described above, because cap structure 625 is attached to stiffener 620 after encapsulation. Therefore, mold compound 605 need not flow through pressure release opening 1915 into cavity 630.

Additional Die-Up Array Packages Incorporating the Cap Structure

FIGS. 20-24 illustrate cross-sectional views of BGA packages, in accordance with embodiments of the present invention, with additional thermal enhancements. These additional thermal enhancements can also be incorporated into the BGA packages described elsewhere herein, including those shown in FIGS. 12, 17-19, 25, 26, 28 and 29.

Figure 20:
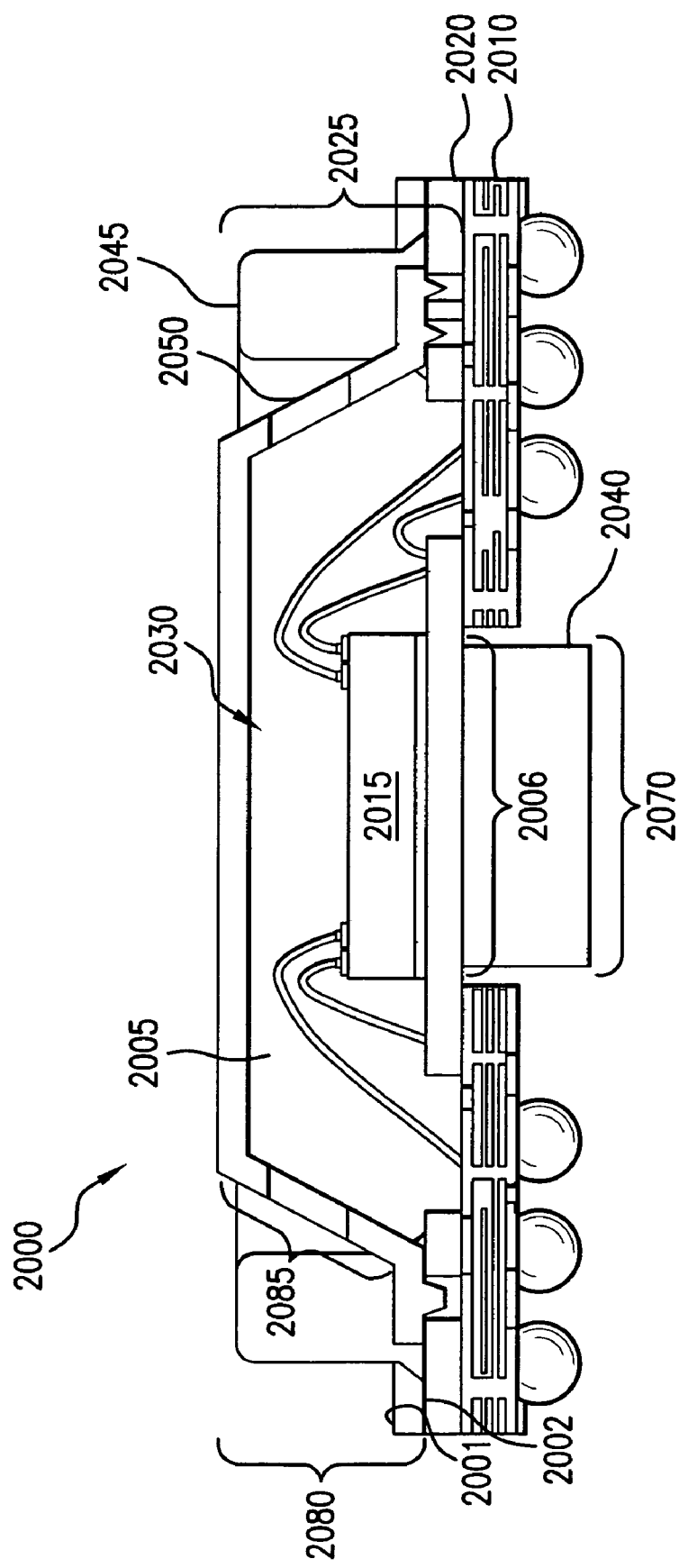
FIGS. 20-24 illustrate cross-sectional views of BGA packages, in accordance with embodiments of the present invention, configured with enhanced thermal properties.

FIG. 20 illustrates a cross-sectional view of a BGA package 2000, in accordance with an embodiment of the present invention. (See, e.g. U.S. patent application Ser. No. 10/284,312 "Ball Grid Array Package Enhanced With A Thermal And Electrical Connector" to Zhao et al., which is herein incorporated by reference). BGA package 2000 includes and IC die 2015, a package substrate 2010, a stiffener 2020, a cap body 2025, and a thermal/electrical connector 2040. IC die 2015 is mounted to a central area of top surface 2001 of stiffener 2020. A second surface 2002 of stiffener 2020 is attached to substrate 2010. Substrate 2010 has a central opening 2070 that exposes a central area 2006 of second surface 2002 of stiffener 2020. Cap body 2025 is attached to top surface 2001 of stiffener 2020, forming a die enclosure 2080.

Thermal/electrical connector 2040 (also referred to herein as a "heat slug") is attached to central area 2006 of second surface 2002 of stiffener 2020 through opening 2070 in substrate 2010. Thermal/electrical connector 2040 is configured to be soldered to a PCB during surface mount. BGA package 2000 provides enhanced heat spreading because thermal/electrical connector 2040 reduces the thermal resistance between IC die 2015 and the PCB. In an embodiment, connector 2040 can be attached to a ground or other potential of the PCB. In such an embodiment, BGA package 2000 also provides enhanced EMI shielding because thermal/electrical connector 2040 reduces the ground (or other voltage) connection impedance of die enclosure 2080 to the PCB.

BGA package 2000 is encapsulated by dam-and-fill encapsulation. After cap body 2025 is attached to stiffener 2020, a dam 2045 is applied around the periphery of cap body 2025, partially covering stiffener 2020. A mold compound 2005 is subsequently applied, filling the area between dam 2045 and cap body 2025. Mold compound 2005 flows into a cavity 2030 through one or more mold gate openings 2050 in sidewall portions 2085 of cap body 2025.

Figure 21:
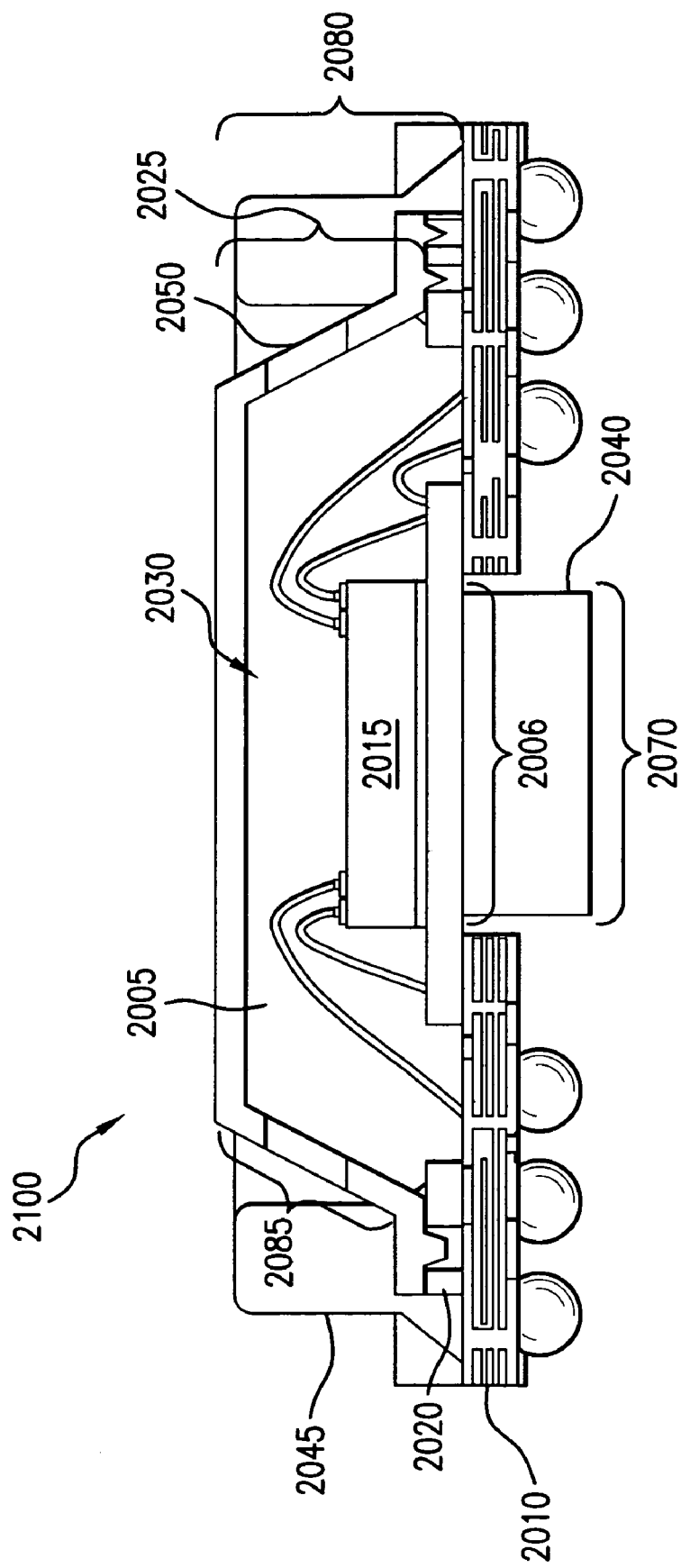

FIG. 21 illustrates a cross-sectional view of a BGA package 2100, in accordance with an embodiment of the present invention. BGA package 2100 is similar to BGA package 2000, shown in FIG. 20, except that the edges of stiffener 2020 are not flush with the edges of substrate 2010. Instead, the edges of stiffener 2020 are flush with those of cap body 2025.

Figure 22:
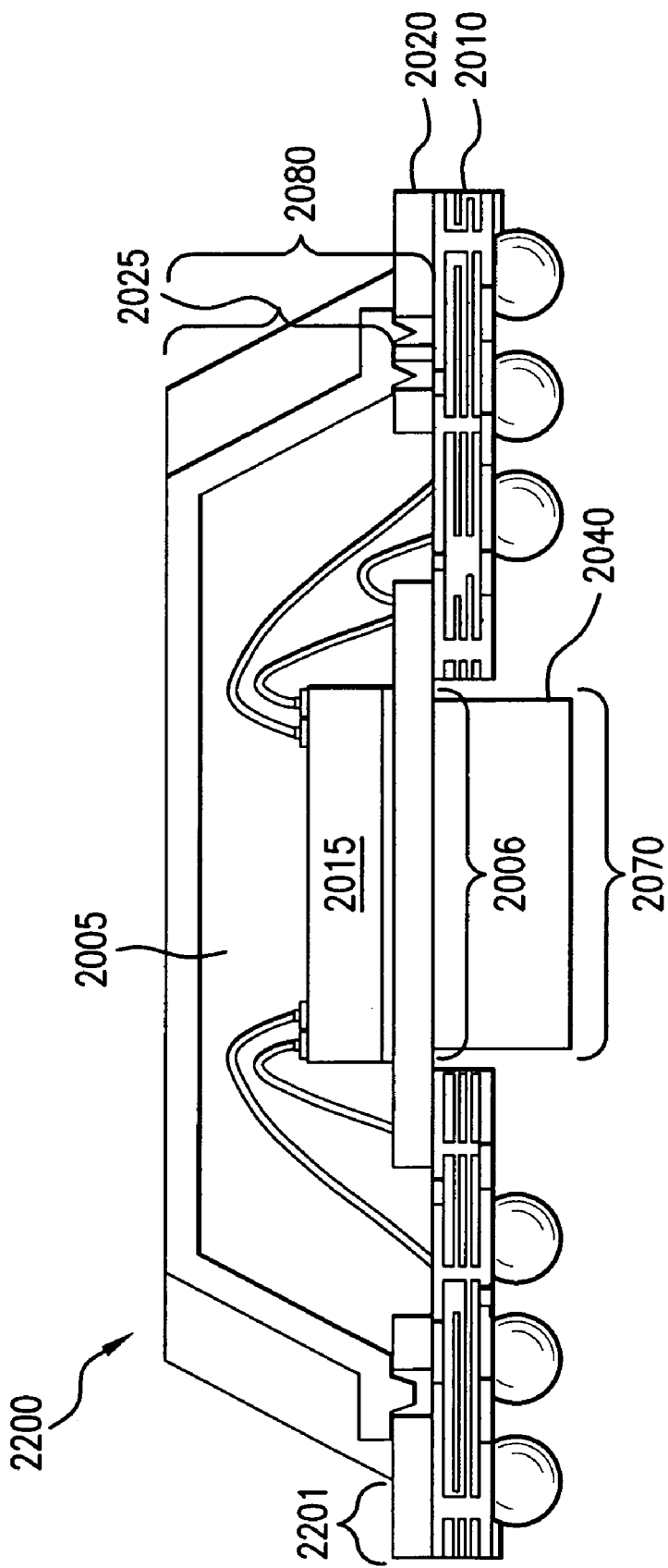

FIG. 22 illustrates a cross-sectional view of a BGA package 2200, in accordance with an embodiment of the present invention. BGA package 2200 is similar to BGA package 2000, shown in FIG. 20, except that BGA package 2200 is encapsulated by a mold injection process. In BGA package 2200, mold compound 2005 does not extend to the edges of stiffener 2020, leaving areas 2201 of stiffener 2020 exposed through, or not covered by mold compound 2005.

Figure 23:
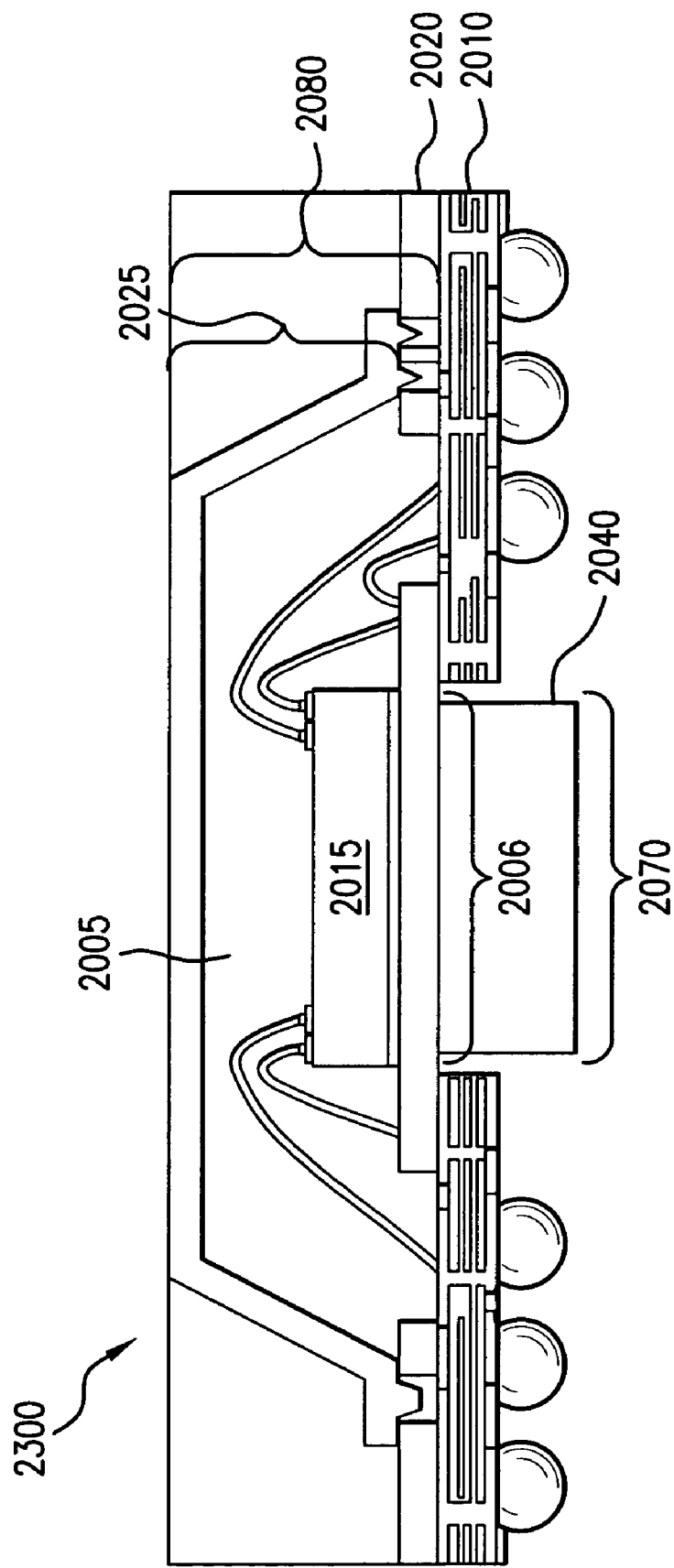

FIG. 23 illustrates a cross-sectional view of a BGA package 2300, in accordance with an embodiment of the present invention. BGA package 2300 is similar to BGA package 2200, shown in FIG. 22, except that mold compound 2005 extends to the edges of stiffener 2020. For example, in this embodiment, BGA package 2300 can be encapsulated over the entire substrate strip or panel and separated by a saw singulation process.

Figure 24:
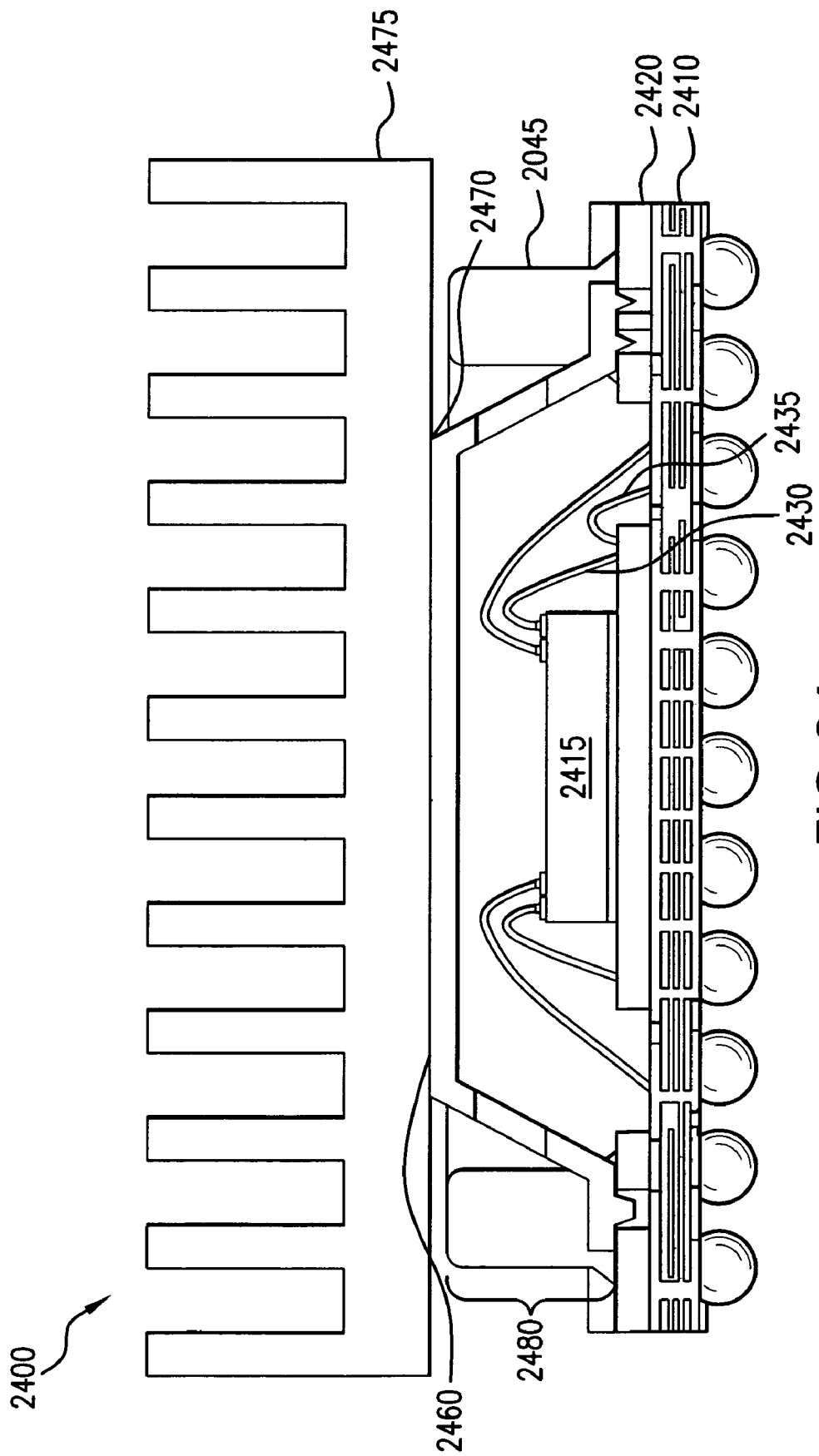
Figure 25:
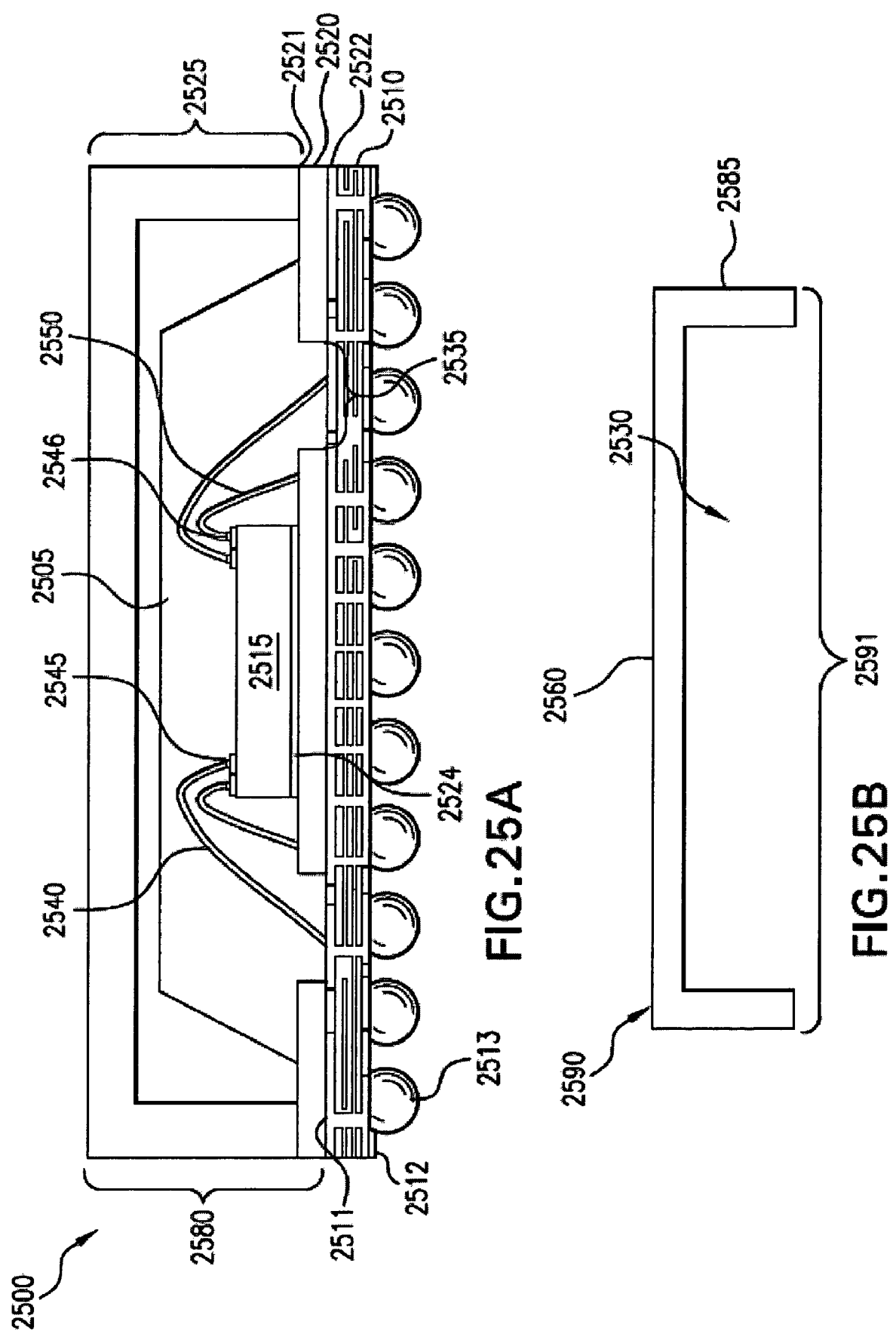
FIG. 25A illustrates a cross-sectional view of a BGA package, in accordance with an embodiment of the present invention, having a can structure integrated with a stiffener.
FIG. 25B illustrates the can structure of FIG. 25A, in accordance with an embodiment of the present invention.

FIG. 24 illustrates a cross-sectional view of a BGA package 2400, in accordance with an embodiment of the present invention. BGA package 2400 is similar to BGA package 1600, shown in FIG. 16, except that an external heat sink 2475 is attached to top portion 2460 of cap body 2425 with a thermally and/or electrically conductive interface or adhesive material 2470. Cap body 2425 and a stiffener 2420 form a die enclosure 2480. Note that for illustrative purposes, a particular type of heat sink is shown in FIG. 24. However, any type of heat sink may be attached to top portion 2460.

External heat sink 2475 enhances heat spreading; however, it can operate as an antenna that undesirably radiates EMI. To reduce EMI, a heat sink ground jumper wire can be used to ground the external heat sink to a PCB. A ground jumper wire is not required, however, if the external heat sink is attached to a grounded die enclosure. For example, in an embodiment, a heat sink ground jumper wire is not required for BGA package 2400 because external heat sink 2475 is attached to die enclosure 2480, which is coupled to a ground potential through ground wires bonds 2430 and/or 2435.

Can Structure for Heat Spreading and EMI Shielding

As described above, a cap structure in a die-up array-type IC device package can have various configurations. Another example configuration is a one-piece cap structure having no rim, which is referred to herein as a "can" structure. An example of a can structure is described as follows with respect to FIG. 25.

FIG. 25A illustrates a cross-sectional view of a BGA package 2500, in accordance with an embodiment of the present invention. BGA package 2500 includes an IC die 2515, a printed circuit substrate 2510, a stiffener 2520, and a can body 2525. IC die 2515 is mounted to a center region of a first surface 2521 of stiffener 2520 with a die attach material 2524, such as epoxy or solder. Can body 2525 and stiffener 2520 form a die enclosure 2580 that substantially surrounds IC die 2515. A second surface 2522 of stiffener 2520 is attached to a first surface 2511 of a package substrate 2510. A plurality of solder balls 2513 is coupled to a second surface 2512 of substrate 2510. Solder balls 2513 are reflowed to attach package 2500 to a PCB.

BGA package 2500 further includes openings 2535, wire bonds 2540 and 2550, and a mold compound 2505. Openings 2535 formed in stiffener 2520 facilitate interconnection of one or more wire bonds 2540 between corresponding bond pads 2545 and substrate 2510. Pads 2545 can be any type of signal pads of IC die 2515, such as I/O pads, voltage pads, ground pads, etc. One or more wire bonds 2550 couple ground pads 2546 to stiffener 2520. Pads 2546 can be any type of signals pads of IC die 2515, such as I/O pads, voltage pads, etc. Mold compound 2505 encapsulates IC die 2515 and wire bonds 2540 and 2550.

FIG. 25B illustrates a cross-sectional view of can body 2525, shown in FIG. 25A. In this embodiment, a can body 2525 has a horizontal planar top portion 2560 and sidewall portions 2585 that form a ninety degree angle to top portion 2560. Can body 2525 further has a first surface 2590 and a second surface 2591. Second surface 2591 has a cavity 2530 with a rectangular cross-section formed therein. Second surface 2591 is coupled to a first surface 2521 of stiffener 2520.

Die enclosure 2580 provides enhanced heat spreading and EMI shielding, while also providing enhanced structural integrity and environmental protection for package 2500. BGA package 2500 is similar to BGA package 600, described above. Accordingly, features of BGA package 600 described above are generally similar to the corresponding features of BGA package 2500 (e.g., example materials for the can structure, stiffener, substrate, encapsulating material, etc.; use of electrically conductive plated areas to enhance electrical coupling of the can structure to the stiffener; use of interlocking tabs and receptacles to enhance structural coupling of the can structure to the stiffener; use of a thermal/electrical connector and/or an external heart sink to enhance heat spreading; etc.). Thus, these features are not necessarily described in detail here for reasons of brevity.

Ring and Lid Structures for Heat Spreading and EMI Shielding

Another example configuration for a cap structure is a two-piece cap structure. For example, in an embodiment, a two-piece cap structure may have a frame-shaped bottom portion, which is coupled to a stiffener, and a planar top portion, which is coupled to the frame-shaped portion. The frame-shaped bottom and planar top portions are referred to herein as "ring" and "lid" structures, respectively, and are described as follows with respect to FIGS. 26-29.

Figure 26:
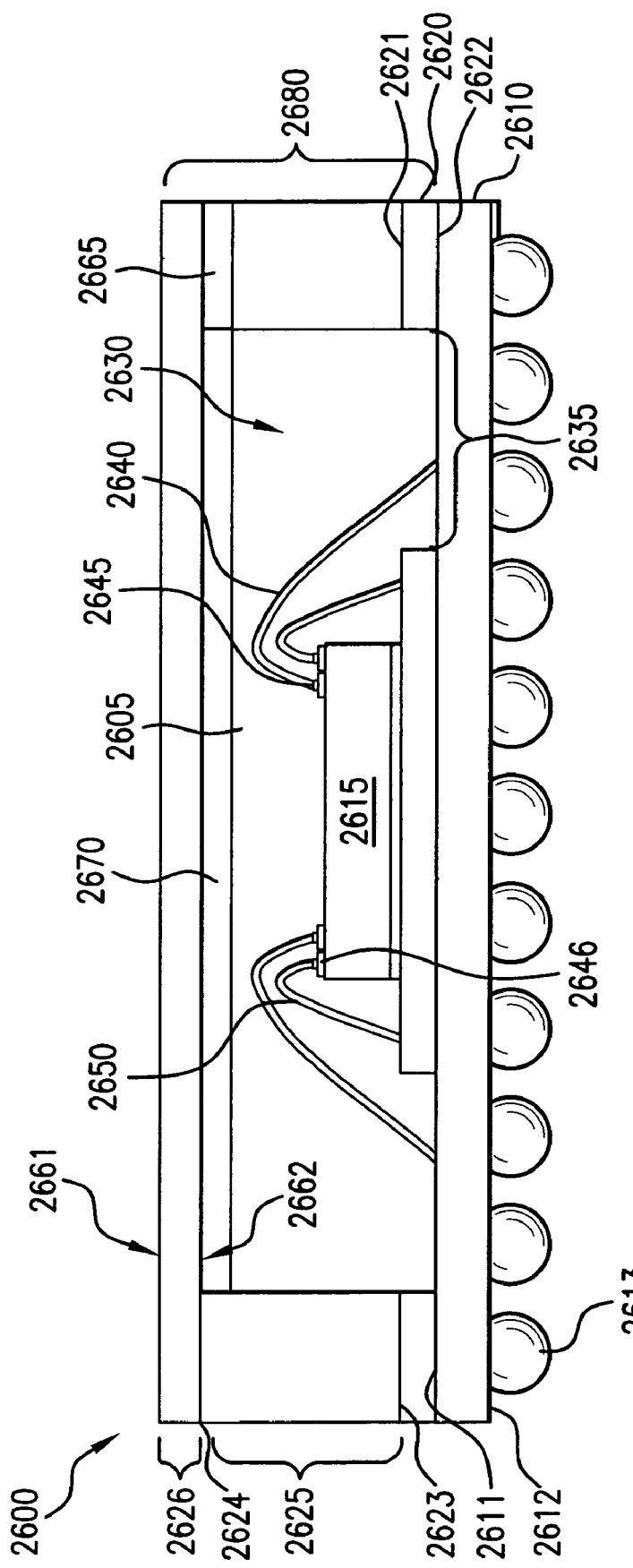
FIG. 26 illustrates a cross-sectional view of a BGA package, in accordance with an embodiment of the present invention, having ring and lid structures integrated with a stiffener.

FIG. 26 illustrates a cross-sectional view of a BGA package 2600, in accordance with an embodiment of the present invention. BGA package 2600 includes an IC die 2615, a printed circuit substrate 2610, a stiffener 2620, a ring structure 2625, and a lid structure 2626. In this embodiment, ring structure 2625 is a frame-shaped structure having a central opening. Lid structure 2626 is planar and has first and second surfaces 2661 and 2662, respectively. A peripheral portion of second surface 2662 of lid structure 2626 is coupled to a first surface 2624 of ring structure 2625. Together, ring structure 2625 and lid structure 2626 form a cavity 2630. Cavity 2630 has a rectangular cross-section. A second surface 2623 of ring structure 2625 is attached to a first surface 2621 of stiffener 2620.

IC die 2615 is mounted to a center region of first surface 2621 of stiffener 2620 with a die attach material 2675, such as epoxy or solder. Lid structure 2626, ring structure 2625, and stiffener 2620 form a die enclosure 2680 that substantially surrounds IC die 2615. A second surface 2622 of stiffener 2620 is attached to a first surface 2611 of package substrate 2610. A plurality of solder balls 2613 is coupled to a second surface 2612 of substrate 2610. Solder balls 2613 are reflowed to attach package 2600 to a PCB.

BGA package 2600 further includes openings 2635, wire bonds 2640 and 2650, and mold compound 2605. Openings 2635 formed in stiffener 2620 facilitate interconnection of one or more wire bonds 2640 between corresponding bond pads 2645 and substrate 2610. One or more wire bonds 2650 couple ground pads 2646 to stiffener 2620. Pads 2645 and 2646 can be any type of signal pads of IC die 2615, such as I/O pads, voltage pads, ground pads, etc. Mold compound 2605 encapsulates IC die 2615 and wire bonds 2640 and 2650. Dam-and-fill encapsulation, or any other encapsulation techniques, can be used to encapsulate IC die 2615 before attaching lid 2626. Because ring 2625 acts as a dam that confines mold compound 2605 within cavity 2630, a dam is not required for a dam-and-fill process. Mold compound 2605 can be filled to just below first surface 2624 of ring structure 2625 so that a gap 2670 is formed between second surface 2662 of lid structure 2626 and mold compound 2605. Alternatively, die enclosure 2680 can be completely filled with mold compound 2605, so that no gap remains.

Figure 27:
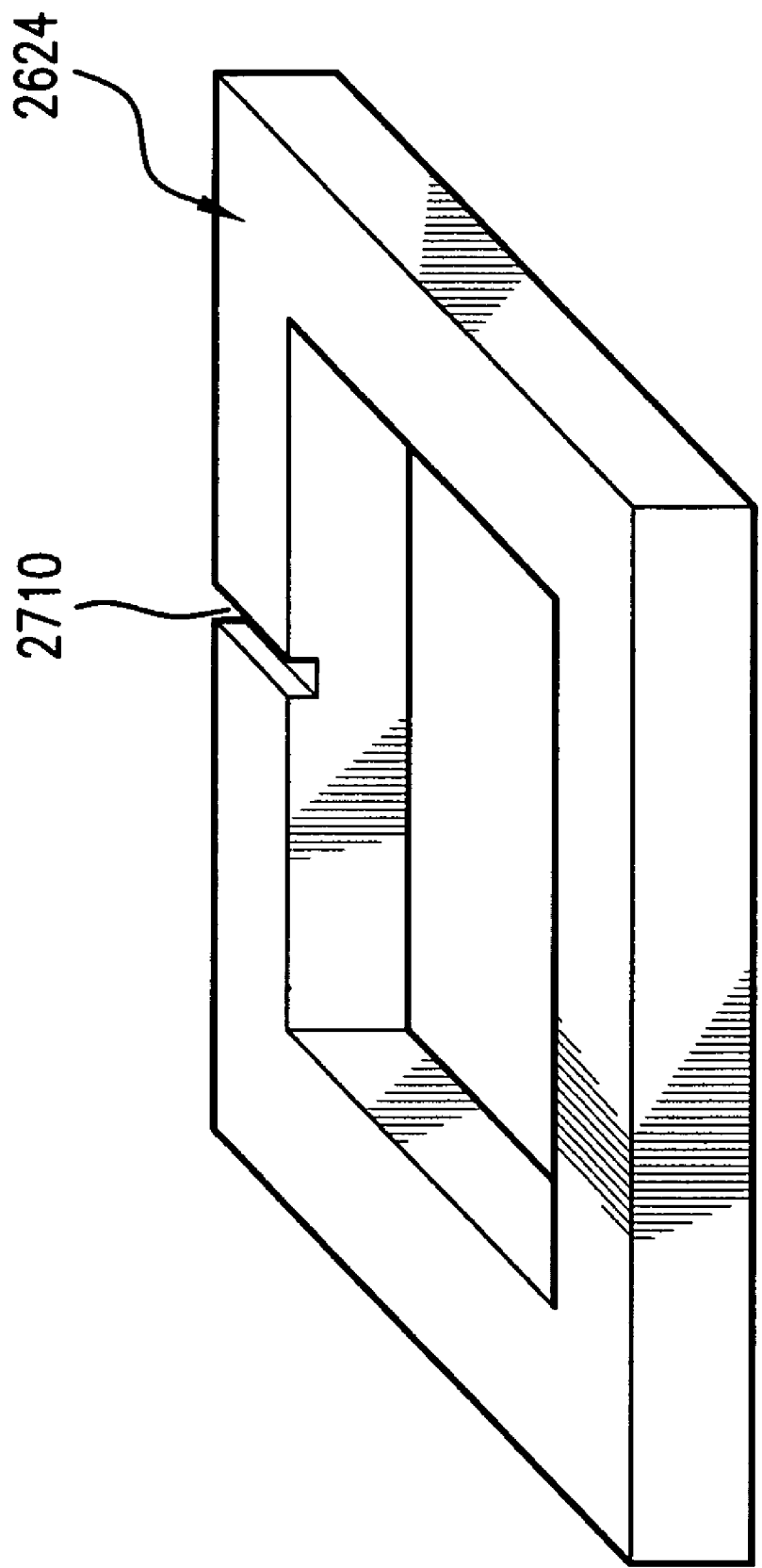
FIG. 27 illustrates a perspective view of a ring structure with a groove formed in a surface, in accordance with an embodiment of the present invention.

In an embodiment, BGA package 2600 further includes a pressure release opening 2665 that extends through a sidewall portion of ring structure 2625. FIG. 27 illustrates a perspective view of ring structure 2625, which has a groove 2710 formed on first surface 2624. When the second surface 2662 of lid structure 2626 is coupled to first surface 2624 of ring structure 2625, groove 2710 forms pressure release opening 2665. Gas, which can be released from materials within cavity 2630, can escape through pressure release opening 2665 and balance the cavity pressure with the ambient pressure. Alternatively, ring structure 2625 can have a pressure release opening formed through an edge portion (not shown).

Figure 28:
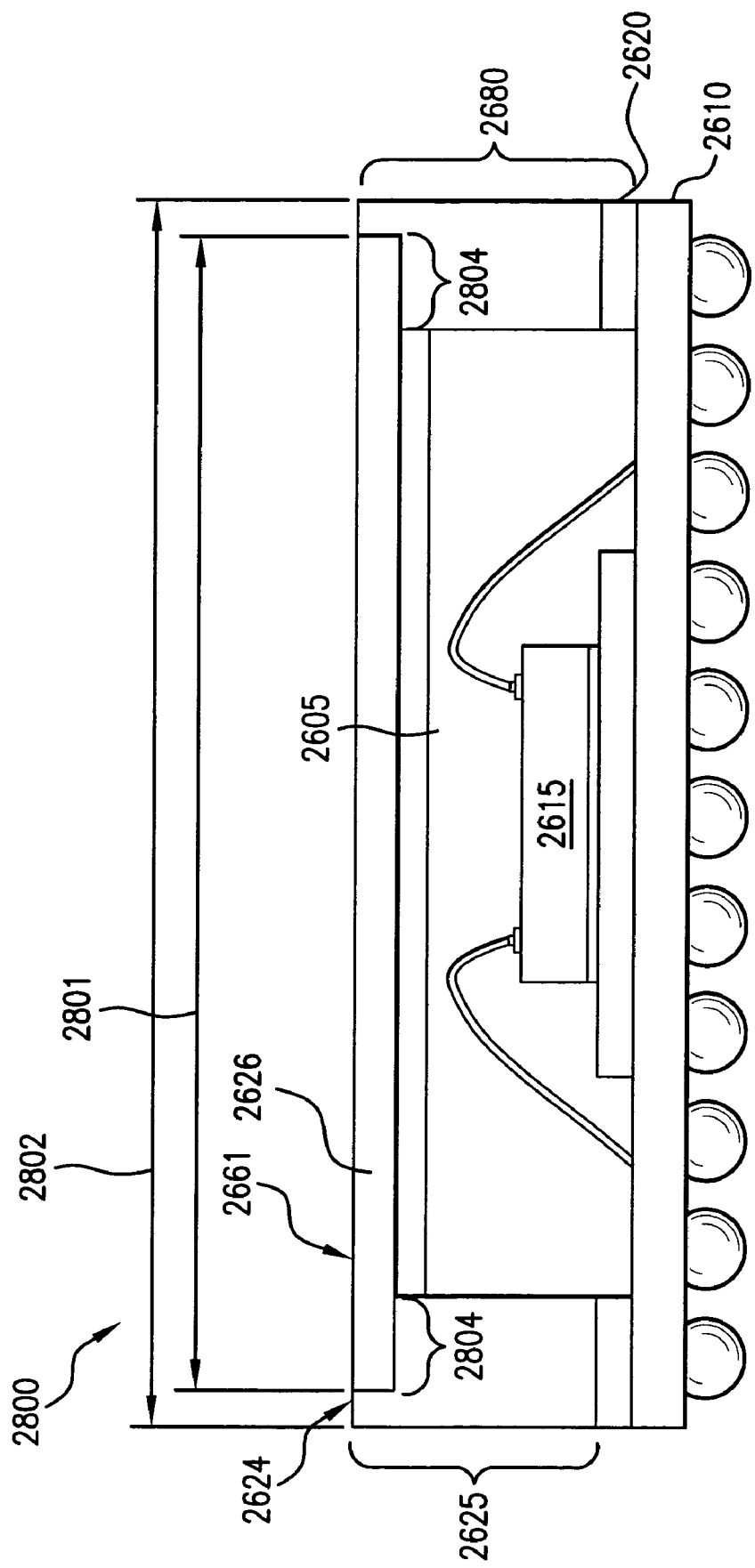
FIGS. 28-29 illustrate cross-sectional views of BGA packages, in accordance with embodiments of the present invention, having lid structures recess-mounted on ring structures.

FIG. 28 illustrates a cross-sectional view of a BGA package 2800, in accordance with an embodiment of the present invention, with ring and lid structures integrated with a stiffener. BGA package 2800 is similar to BGA package 2600, shown in FIG. 26, except that a peripheral dimension 2801 of lid structure 2626 is within a peripheral dimension 2802 of ring structure 2625. Thus, lid structure 2626 can be "recess-mounted" to ring structure 2625, as shown in FIG. 28. As shown in FIG. 28, lid structure 2626 resides in a recessed inner edge 2804 located around the top surface of ring structure 2625. When lid structure 2626 is recess-mounted on ring structure 2625, first surface 2661 of lid structure 2626 can be substantially planar with first surface 2624 of ring structure 2625. Recess-mounting lid structure 2626 on ring structure 2625, as shown in FIG. 28, may enhance structural interlocking of lid structure 2626 and ring structure 2625.

Figure 29:
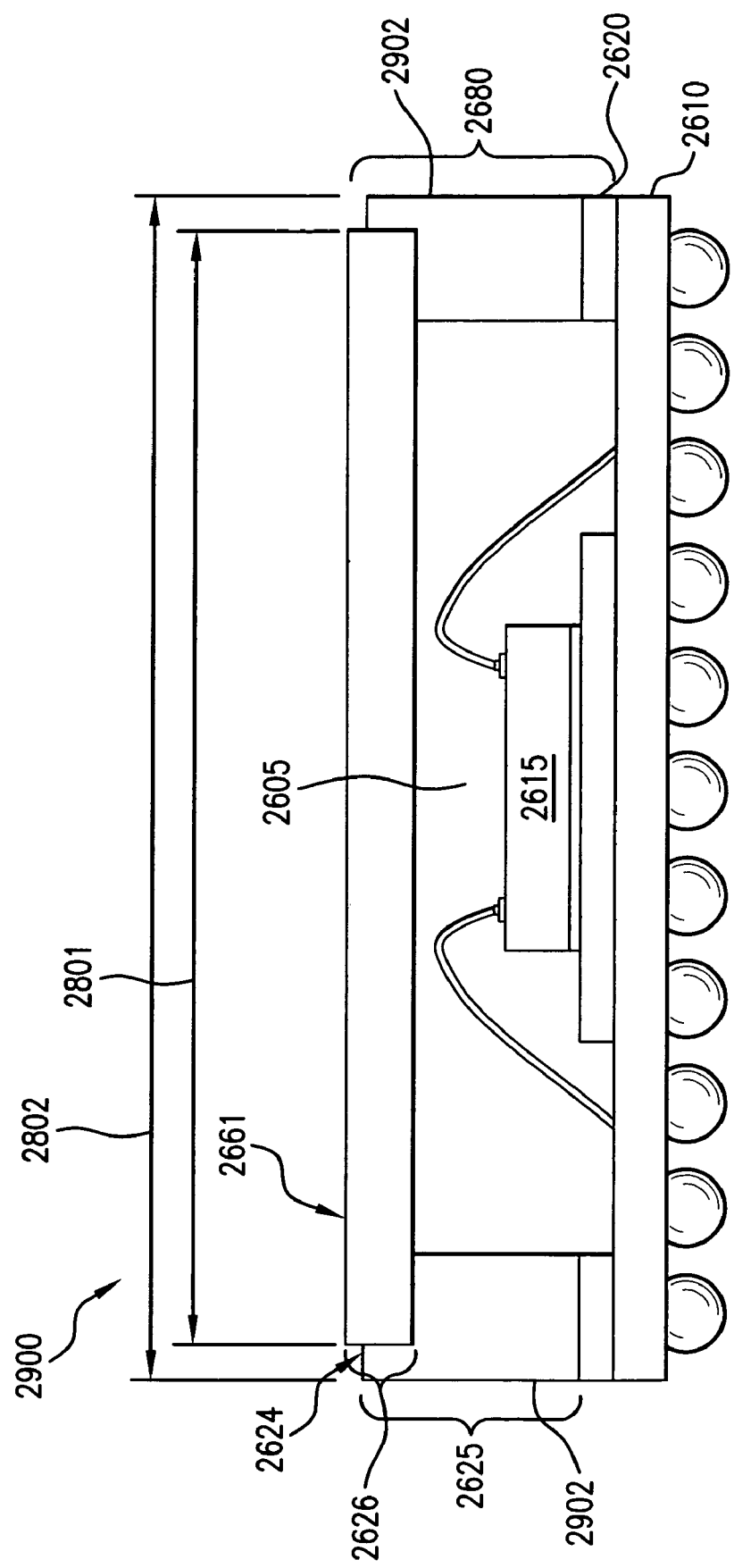

Similarly, FIG. 29 illustrates a cross-sectional view of a BGA package 2900, in accordance with an embodiment of the present invention, with ring and lid structures integrated with a stiffener. BGA package 2900 is similar to BGA package 2800, shown in FIG. 28, except when lid structure 2626 is recess-mounted on ring structure 2625, first surface 2661 of lid structure 2626 protrudes above first surface 2624 of ring structure 2625. Thus, in the embodiment of FIG. 29, a recessed inner edge 2902 around the top of ring structure 2625 has a depth that is less than a thickness of lid structure 2626. Recess-mounting lid structure 2626 on ring structure 2625, as shown in FIG. 29, may enhance structural interlocking of lid structure 2626 and ring structure 2625.

Die enclosure 2680, shown in FIGS. 26, 28, and 29, provides enhanced heat spreading and EMI shielding, while also providing enhanced structural integrity and environmental protection for packages 2600, 2800, and 2900, respectively. BGA packages 2600, 2800, and 2900 are similar to BGA package 600, described above. Accordingly, features of BGA package 600 described above are generally similar to the corresponding features of BGA packages 2600, 2800, and 2900 (e.g., example materials for ring and lid structures, stiffener, substrate, encapsulating material, etc.; use of electrically conductive plated areas to enhance electrical coupling of the ring structure to the stiffener; use of interlocking tabs and receptacles to enhance structural coupling of the ring structure to the stiffener; use of a thermal/electrical connector and/or an external heart sink to enhance heat spreading; etc.). Thus, these features are not necessarily described in detail here for reasons of brevity.

Method of Assembling a Die-Up Array IC Device Package

Figure 30:
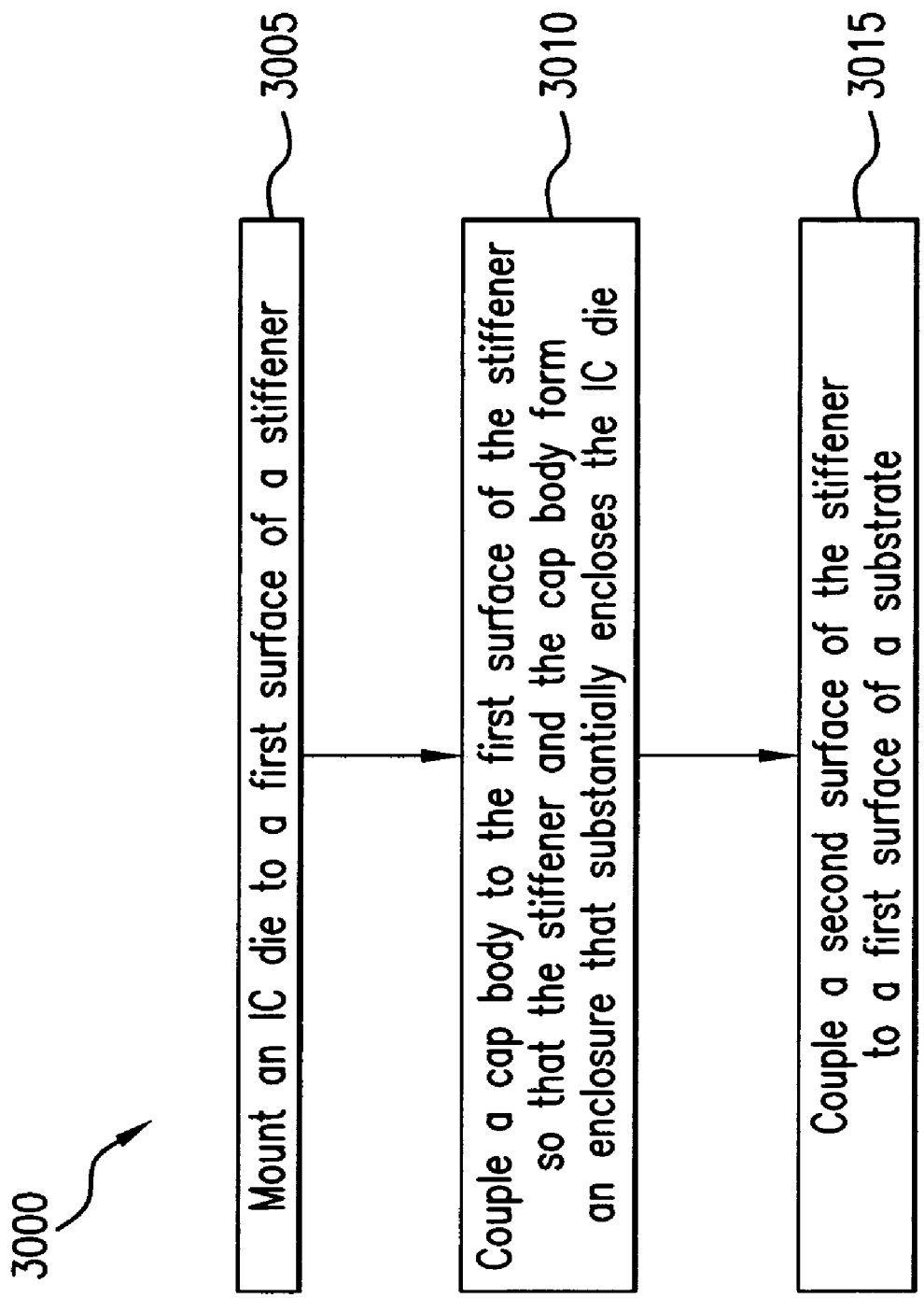
FIGS. 30-33 show flowcharts providing example steps for assembling a die-up array integrated circuit (IC) device package with enhanced thermal and electromagnetic interference (EMI) shielding properties, according to embodiments of the present invention.
Figure 31:
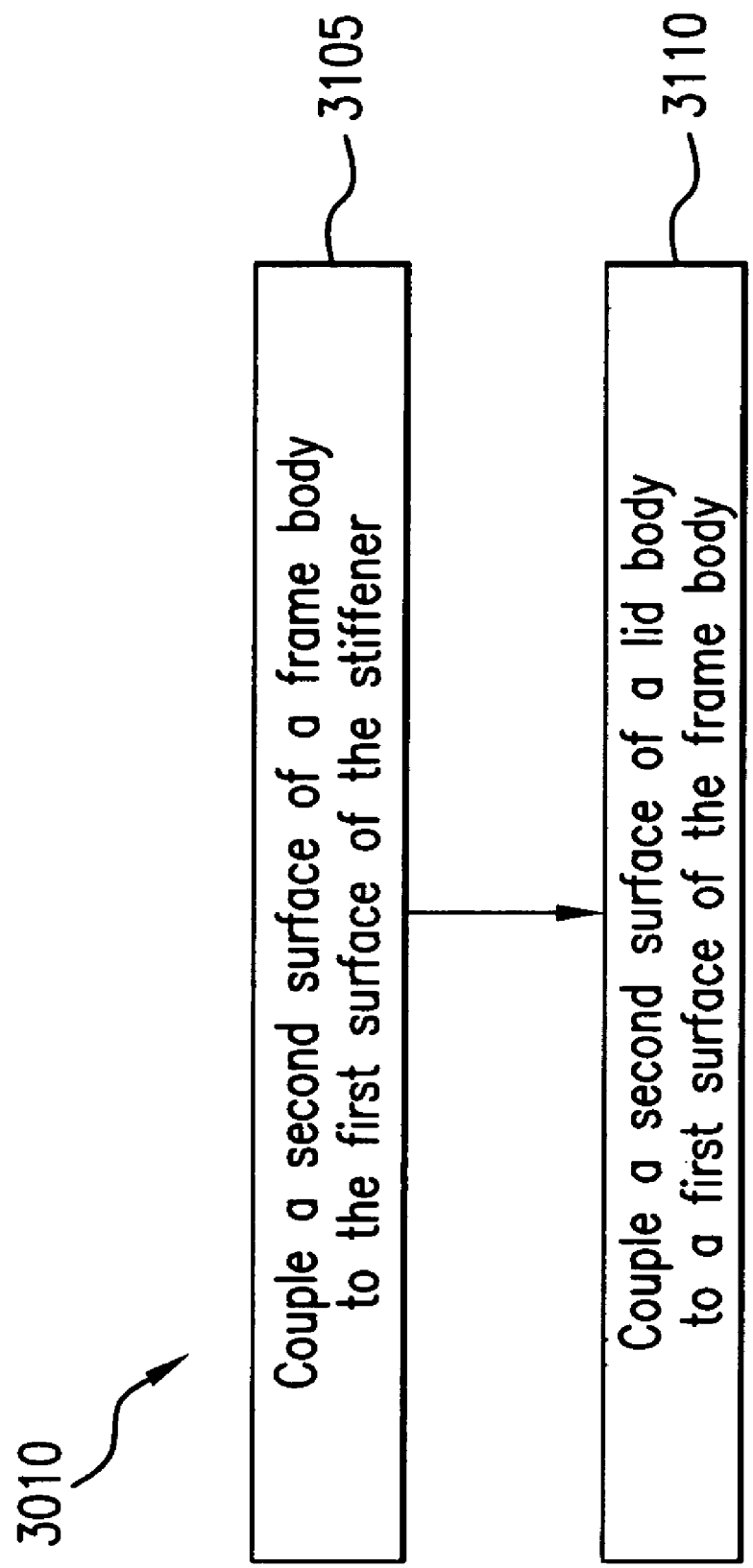
Figure 32:
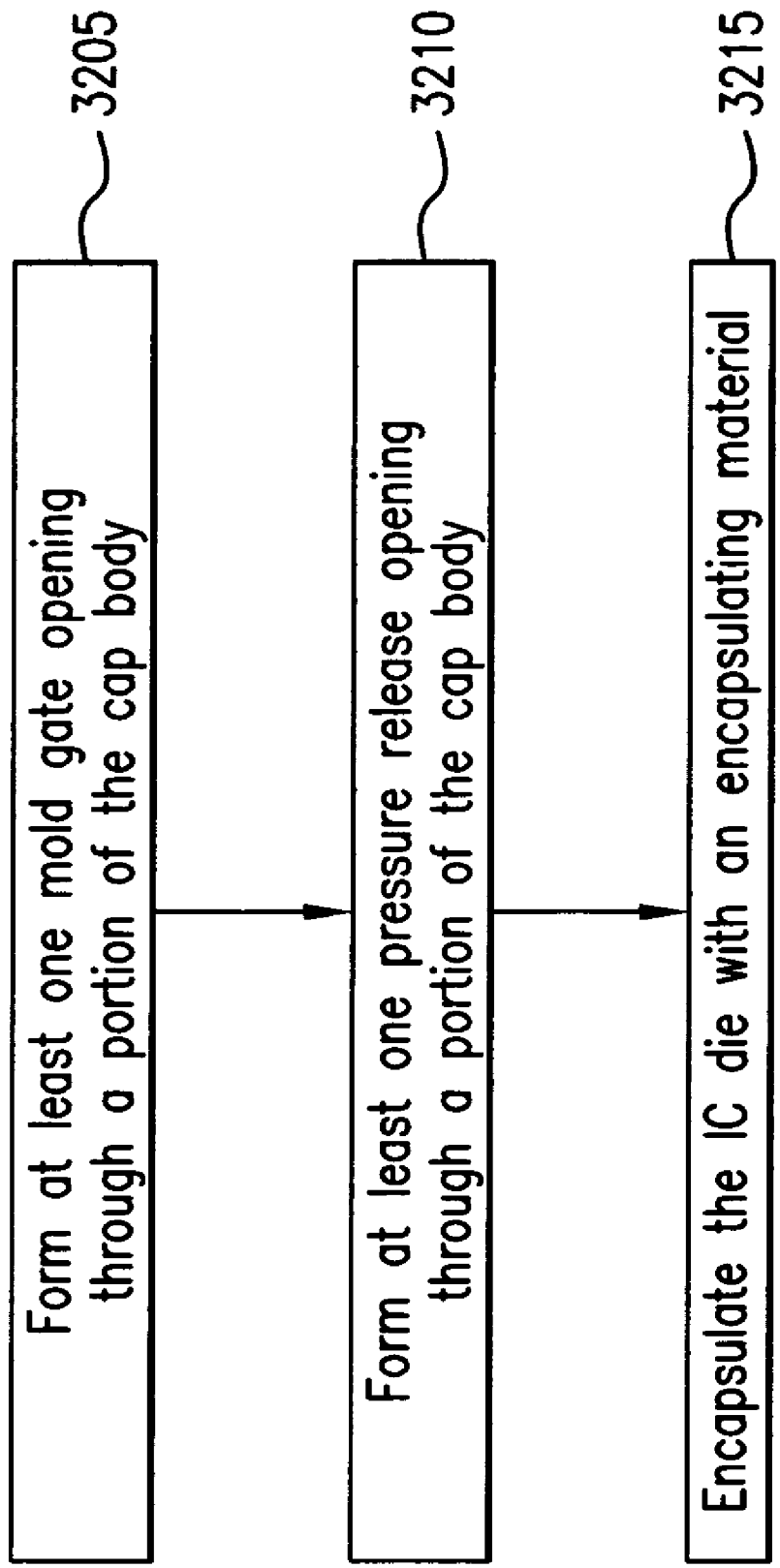
Figure 33:
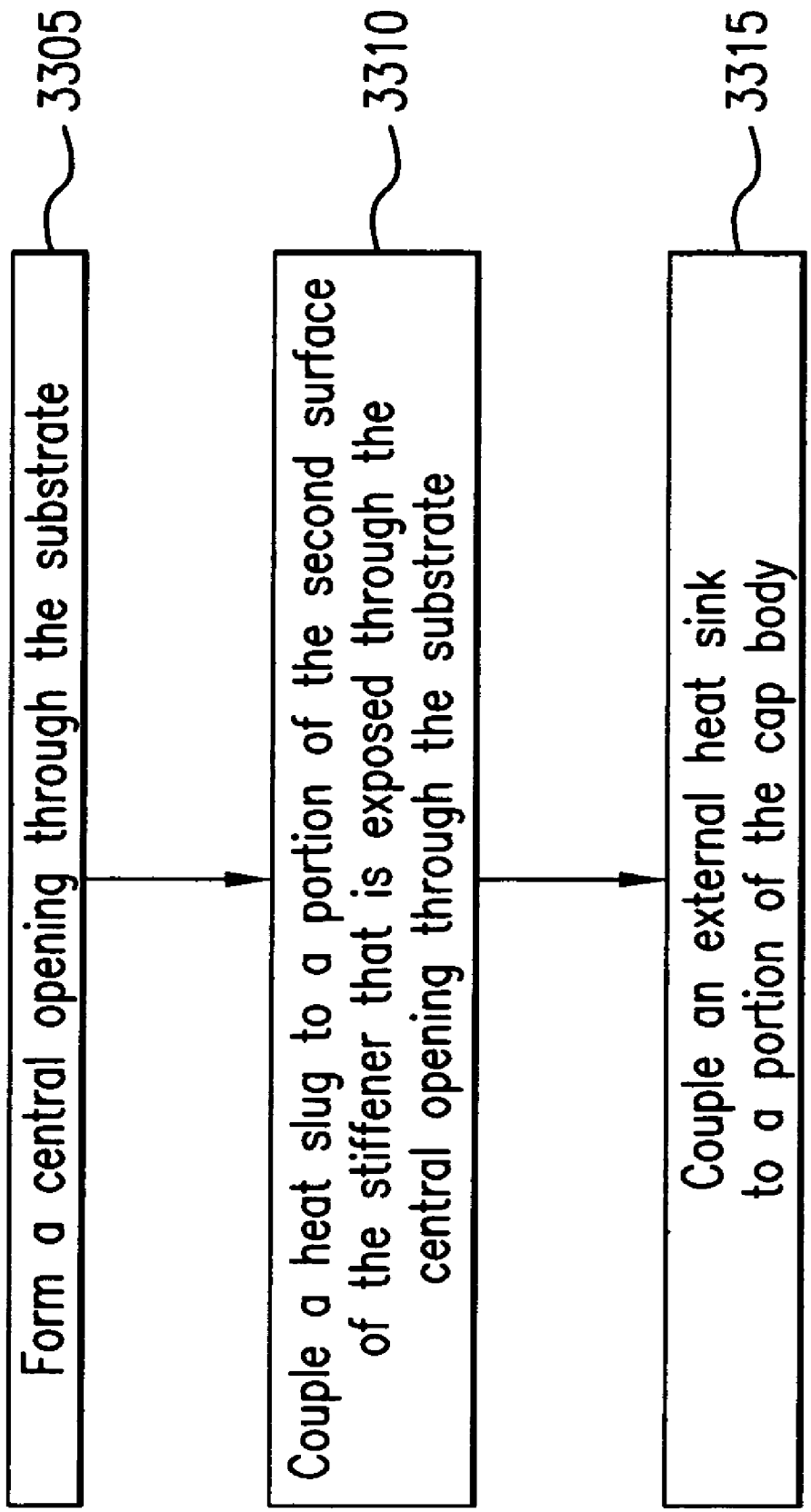

FIG. 30 shows a flowchart 3000 providing steps for assembling a die-up array IC device package with enhanced thermal and/or EMI shielding properties according to one or more embodiments of the present invention. FIGS. 31-33 provide additional optional steps, according to further embodiments of the present invention. The steps of FIGS. 30-33 do not necessarily have to occur in the order shown, as will be apparent to persons skilled in the relevant art(s) based on the teachings herein. Other operational and structural embodiments will be apparent to persons skilled in the relevant art(s) based on the following discussion. These steps are described in detail below.

Flowchart 3000 is shown in FIG. 30, and begins with step 3005. In step 3005, an IC die is mounted to a first surface of a stiffener. For example, the IC die is IC die 615 and the stiffener is stiffener 620, as shown in FIG. 6A, or any one of the stiffeners shown in FIGS. 7A-7C, 9A-9C, 10-12, 14-26, 28, and 29.

In step 3010, a cap body is coupled to the first surface of the stiffener. The first surface of the stiffener and a cavity in a second surface of the cap body form an enclosure that substantially encloses the IC die. For example, the cap body is cap body 625, the stiffener is stiffener 620, the cavity is cavity 630, the IC die is IC die 615, and the die enclosure is die enclosure 680, as shown in FIG. 6A, or any one of the corresponding elements shown in FIGS. 6B, 7A-C, 8A and 8B, 9A-9C, 10-26, 28, and 29.

In step 3015, a second surface of the stiffener is coupled to a first surface of a substrate. For example, the stiffener is stiffener 620 and the substrate is substrate 610, shown in FIG. 6A, or any of the substrates shown in FIGS. 10-12, 14-26, 28, and 29.

In another embodiment, step 3010 of flowchart 3000 includes the additional steps shown in FIG. 31. In step 3105, a second surface of a frame body is coupled to the first surface of the stiffener. For example, the frame body is ring structure 2625, and the stiffener is stiffener 2610, as shown in FIG. 26, or any of the ring structures shown in FIGS. 27-29.

In step 3110, a second surface of a lid body is coupled to a first surface of the frame body. The stiffener, the frame body, and the lid body form an enclosure that substantially encloses the IC die. For example, the lid body is lid structure 2626, the frame body is ring structure 2625, the stiffener is stiffener 2620, the die enclosure is die enclosure 2680, and the IC die is IC die 2615, as shown in FIG. 26, or any of the corresponding elements shown in FIGS. 28 and 29.

In another embodiment, flowchart 3000 includes one or more of the additional steps shown in FIG. 32. Note that any one or any combination of steps 3205, 3210, and 3215, shown in FIG. 32, can be performed. In step 3205, at least one mold gate opening is formed through a portion of the cap body. For example, the cap body is cap body 625, and the at least one mold gate opening is mold gate opening 1105, as shown in FIG. 11, or any of the mold gate openings shown in FIGS. 12, 13, 15, 16, 20, 21, and 24.

In step 3210, at least one pressure release opening is formed through a portion of the cap body. For example, the cap body is cap body 625, and the at least one pressure release opening is pressure release opening 1715, as shown in FIG. 17, or any of the pressure release openings shown in FIGS. 18 and 19.

In step 3215, the IC die is encapsulated with an encapsulating material. For example, the IC die is IC die 615, and the encapsulating material is mold compound 605, as shown in FIG. 6A, or any one of the corresponding elements shown in FIGS. 10-12, 14-26, 28, and 29. In step 3215, conventional IC die encapsulation processes can be used, such as dam-and-fill (glob top), injection molding, strip or panel over-molding, saw-singulation, and any other IC die encapsulation processes.

In another embodiment, flowchart 3000 includes one or more of the additional steps pertaining to thermal enhancement shown in FIG. 33. Note that steps 3305 and 3310 need not be performed in conjunction with step 3315, and that step 3315 need not be performed in conjunction with steps 3305 and 3310. In step 3305, a central opening is formed through the substrate. For example, the substrate is substrate 2010, and the central opening is opening 2070, as shown in FIG. 20, or any of the corresponding elements shown in FIGS. 21-23.

In step 3310, a heat slug (also referred to herein as a "thermal/electrical connector") is coupled to a portion of the second surface of the stiffener that is exposed through the central opening through the substrate. For example, the heat slug is thermal/electrical connector 2040, the stiffener is stiffener 2020, the exposed second surface of the stiffener is exposed central area 2006, the substrate is substrate 2010, and the central opening through the substrate is opening 2070, as shown in FIG. 20, or any of the corresponding elements shown in FIGS. 21-23.

In step 3315, an external heat sink is coupled to a portion of the cap body. For example, the external heat sink is external heat sink 2475, the cap body is cap body 2425, and the portion of the cap body to which the external heat sink is attached is top portion 2460, as shown in FIG. 24.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A die-up array integrated circuit (IC) device package, comprising:
   a stiffener having opposing first and second surfaces;
   a frame body having opposing first and second surfaces, said frame body further having a central opening that is open at said first and second surfaces of said frame body, wherein said second surface of said frame body is coupled to said first surface of said stiffener;
   an IC die mounted to said first surface of said stiffener within said central opening;

a planar lid having opposing first and second surfaces, wherein said second surface of said lid is coupled to said first surface of said frame body; and wherein said second surface of said lid overlaps said central opening through said frame body; and a substrate having a first surface coupled to said second surface of said stiffener, wherein a plurality of contact pads on said first surface are electrically connected through said substrate to an array of electrically conductive terminals on a second surface of said substrate;

wherein said stiffener, said frame body, and said lid form an enclosure structure that substantially encloses said IC die, wherein said stiffener further comprises:

a first portion having at least one electrically conductive plated area patterned on said first surface in one or more areas in electrical contact with said frame body; and a second portion separated from said first portion by a channel through said stiffener, wherein said second portion is electrically isolated from said first portion.

2. The package of claim 1, wherein said enclosure structure spreads heat from said IC die during operation of said IC die.

3. The package of claim 1, wherein said enclosure structure shields electromagnetic interference (EMI) emanating from said IC die and EMI radiating toward said IC die from outside the package.

4. The package of claim 1, wherein said central opening through said frame body has a substantially rectangular cross-section.

5. The package of claim 1, further comprising:
at least one electrically conductive plated area deposited on said first surface of said stiffener in areas in contact with one or more wire bonds.

6. The package of claim 1, further comprising:
at least one wire bond that couples at least one bond pad on a surface of said IC die to said first surface of said stiffener, whereby said enclosure structure is coupled to an electrical potential.

7. The package of claim 6, wherein said at least one bond pad is a ground pad, whereby said enclosure structure is coupled to a ground potential.

8. The package of claim 1, wherein said stiffener includes at least one opening that is open at said first and second surfaces of said stiffener, the package further comprising:
at least one wire bond that couples at least one bond pad on a surface of said IC die to said first surface of said substrate through said at least one opening through said stiffener.

9. The package of claim 1, wherein a peripheral dimension of said frame body substantially coincides with a peripheral dimension of said stiffener.

10. The package of claim 1, wherein said IC die is centrally mounted on said first surface of said stiffener.

11. The package of claim 1, wherein said array of electrically conductive terminals includes one of an array of solder balls, pins, or pads.

12. The package of claim 1, further comprising:
an encapsulating material that encapsulates said IC die.

13. The package of claim 12, further comprising:
an air gap between said encapsulating material and said second surface of said lid.

14. The package of claim 12, wherein said frame body further comprises:
at least one groove formed in said first surface of said frame body, wherein said groove and said second surface of said lid form an opening through said frame body that is open at said first surface of said frame body and said central opening.

15. The package of claim 14, wherein said opening through said frame body is configured to facilitate release of an air pressure inside said enclosure structure.

16. The package of claim 1, wherein said first surface of said frame body includes a recessed inner edge portion.

17. The package of claim 16, wherein said lid is recess-mounted in said recessed inner edge portion of said frame body.

18. The package of claim 17, wherein said first surface of said lid is substantially flush with said first surface of said frame body.

19. The package of claim 17, wherein said first surface of said lid protrudes relative to said first surface of said frame body.

* * * * *